United States Patent
Sakamoto et al.

(10) Patent No.: US 6,562,660 B1
(45) Date of Patent: May 13, 2003

(54) METHOD OF MANUFACTURING THE CIRCUIT DEVICE AND CIRCUIT DEVICE

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/671,220

(22) Filed: Sep. 27, 2000

(30) Foreign Application Priority Data

Mar. 8, 2000 (JP) ........................ 2000-063218
Mar. 8, 2000 (JP) ........................ 2000-063219

(51) Int. Cl.[7] .................... H01L 21/44; H01L 21/48; H01L 21/50
(52) U.S. Cl. .................. 438/124; 438/106; 438/108; 438/110; 438/118; 438/121; 438/127; 438/666
(58) Field of Search ................ 438/106, 108, 438/110, 118, 121, 124, 127, 666

(56) References Cited

U.S. PATENT DOCUMENTS

| | | | | | |
|---|---|---|---|---|---|
| 5,656,550 | A | * | 8/1997 | Tsuji et al. | 438/123 |
| 5,976,912 | A | * | 11/1999 | Fukutomi et al. | 438/110 |
| 6,238,952 | B1 | * | 5/2001 | Lin | 438/110 |
| 6,294,830 | B1 | * | 9/2001 | Fjelstad | 257/724 |

* cited by examiner

*Primary Examiner*—David L. Talbott
*Assistant Examiner*—David A. Zarneke
(74) *Attorney, Agent, or Firm*—Fish & Richardson P.C.

(57) ABSTRACT

After a trench 54 is formed in a first conductive foil 60A, the circuit elements are mounted, and the insulating resin is applied on the laminated conductive foil 60 as the support substrate. After being inverted, a second conductive foil 60B is etched on the insulating resin 50 as the support substrate for separation into the conductive paths. Accordingly, it is possible to fabricate the circuit device in which the conductive paths 51 and the circuit elements 52 are supported by the insulating resin 50, without the use of the support substrate. And the interconnects L1 to L3 for the circuit are formed, and can be prevented from slipping because of the curved structure and a visor 58.

29 Claims, 16 Drawing Sheets

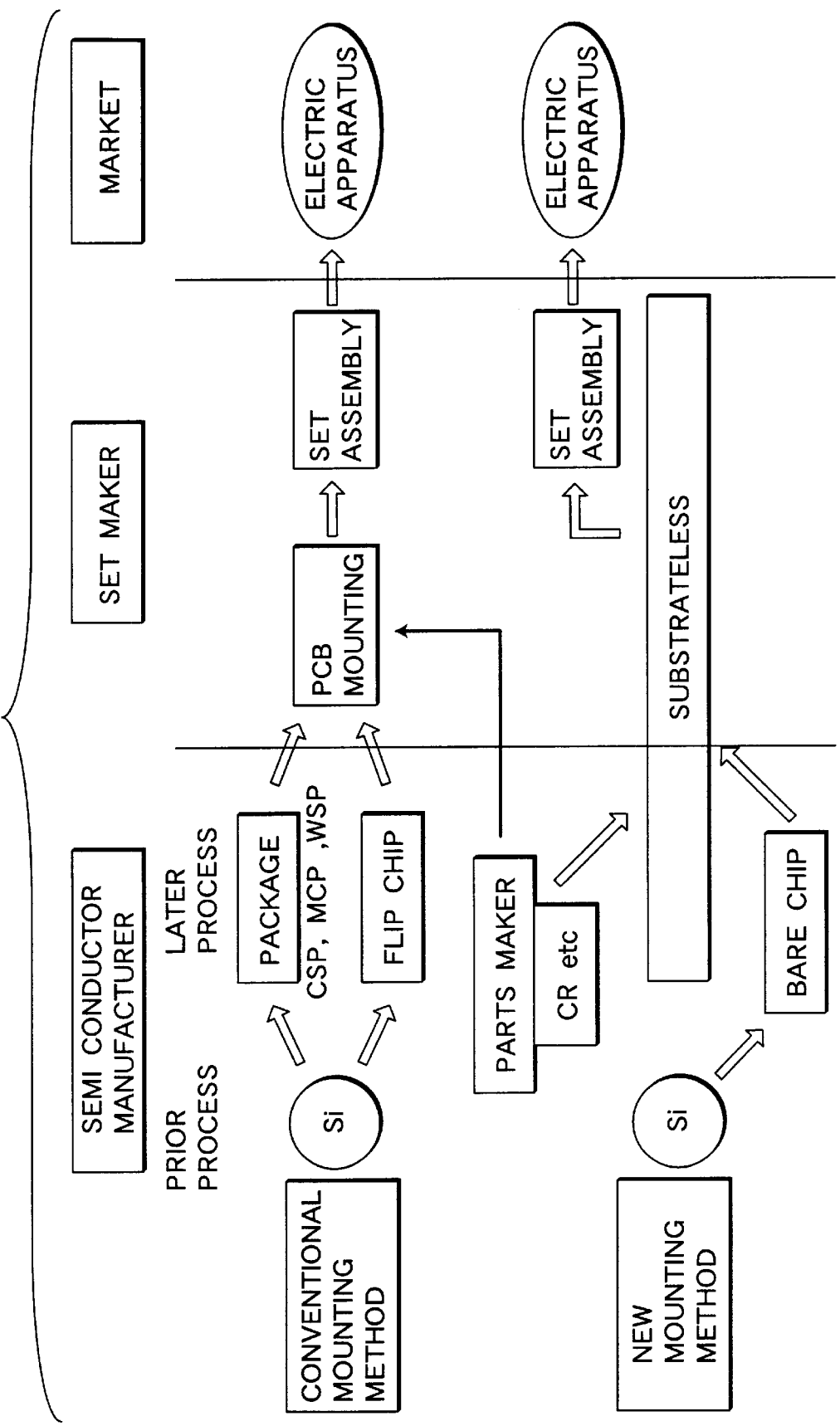

METHOD OF MANUFACTURING THE CIRCUIT DEVICE AND CIRCUIT DEVICE

BACKGROUND OF THE INVENTION

1. Field of the Invention

The present invention relates to a method of manufacturing a circuit device and the circuit device, and more particularly to a method for manufacturing a thin-type circuit device.

2. Description of the Related Art

Conventionally, it has been demanded that a circuit device which is set in an electronic apparatus is reduced in size, thickness and weight, because the circuit device is used for a portable telephone, a portable computer and so on.

For example, a semiconductor device as a circuit device is typically a package type semiconductor device which is conventionally sealed by normal transfer molding. This semiconductor device 1 is mounted on a printed circuit board PS as shown in FIG. 24.

This package type semiconductor device 1 has a semiconductor chip 2 covered with a resin layer 3, with a lead terminal 4 for external connection derived from the side of this resin layer 3.

However, this package type semiconductor device 1 had the lead terminal 4 out of the resin layer 3, and was too large in total size to meet smaller, thinner and lighter requirements.

Therefore, various companies have competed to develop a wide variety of structures which are reduced in size and weight. Recently, a wafer scale CSP which is as large as a chip size, called a CSP (Chip Size Package), or a CSP which is slightly larger than the chip size, has been developed.

FIG. 25 shows a CSP 6 which adopts a glass epoxy substrate 5 as a support substrate and which is slightly larger than a chip size. Herein, a transistor chip T is mounted on the glass epoxy substrate 5.

On the surface of this glass epoxy substrate 5, a first electrode 7, a second electrode 8 and a die pad 9 are formed, and on the back face, a first back electrode 10 and a second back electrode 11 are formed. Via a through hole TH, the first electrode 7 and the first back electrode 10, as well as the second electrode 8 and the second back electrode 11, are electrically connected. On the die pad 9, the bare transistor chip T is fixed. An emitter electrode of transistor and the first electrode 7 are connected via a bonding wire 12, and a base electrode of transistor and the second electrode 8 are connected via the bonding wire 12. Further, a resin layer 13 is provided on the glass epoxy substrate 5 to cover the transistor chip T.

The CSP 6 adopts the glass epoxy substrate 5, which has the merits of a simpler structure extending from the chip T to the back electrodes 10, 11 for external connection, and a less expensive cost of manufacture, than the wafer scale CSP.

The CSP 6 is mounted on the printed circuit board PS, as shown in FIG. 24. The printed circuit board PS is provided with the electrodes and wires making up an electric circuit, and has the CSP 6, the package type semiconductor device 1, a chip resistor CR and a chip capacitor CC fixed for the electrical connection.

A circuit on this printed circuit board is packaged in various sets.

Referring to FIGS. 26 and 27, a method for manufacturing this CSP will be described below. In FIG. 27, reference is made to a flow diagram entitled as a Glass epoxy/flexible substrate, listed in the middle.

Firstly, the glass epoxy substrate 5 is prepared as a base material (support substrate). On both sides of the glass epoxy substrate 5, the Cu foils 20, 21 are applied via an insulating adhesive (see FIG. 26A).

Subsequently, the Cu foils 20, 21 corresponding to the first electrode 7, the second electrode 8, the die pad 9, the first back electrode 10 and the second back electrode 11 are coated with an etching resist 22 and patterned. Note that the patterning may be made separately on the front face and the back face (see FIG. 26B).

Then, using a drill or a laser, a hole for the through hole TH is opened in the glass epoxy substrate. This hole is plated to form the through hole TH. Via this through hole TH, the electrical connection between the first electrode 7 and the first back electrode 10 and between the second electrode 8 and the second back electrode 10 is made (see FIG. 26C).

Further, though being not shown in the figure, the first electrode 7 and the second electrode 8 which become the bonding posts are subjected to Ni plating, and the die pad 9 which becomes a die bonding post is subjected to Au plating to effect die bonding of the transistor chip T.

Lastly, the emitter electrode of the transistor chip T and the first electrode 7, and the base electrode of the transistor chip T and the second electrode 8 are connected via the bonding wire 12, and covered with the resin layer 13 (see FIG. 26D).

As required, individual electrical elements are formed by dicing. In FIG. 26, only one transistor chip T is provided on the glass epoxy substrate 5, but in practice, a matrix of transistor chips T are provided. Accordingly, a dicing apparatus separates them into individual elements.

In accordance with the above manufacturing method, a CSP type electrical element using the support substrate 5 can be completed. This manufacturing method is also effected with the use of a flexible sheet as the support substrate.

On the other hand, a manufacturing method adopting a ceramic substrate is shown in a flow diagram to the left in FIG. 27. After the ceramic substrate which is the support substrate is prepared, the through holes are formed. Then using a conductive paste, the electrodes are printed and sintered on the front face and the back face. Thereafter, the same manufacturing method of FIG. 26, up to coating the resin layer is followed, but since the ceramic substrate is very fragile, and is likely to break off, unlike a flexible sheet or the glass epoxy substrate, there is a problem with the difficulty of molding using a metal mold die. Therefore, a sealing resin is potted and cured, then polished for the uniform treatment of the sealing resin. Lastly, using the dicing apparatus, individual devices are made.

In FIG. 25, the transistor chip T, connecting means 7 to 12, and the resin layer 13 are requisite components for the electrical connection with the outside, and the protection of transistor. However, only these components were difficult to provide an electrical circuit device reduced in size, thickness and weight.

Essentially, there is no need of having the glass epoxy substrate 5 which becomes the support substrate, as described before. However, since the manufacturing method involves pasting the electrode on the substrate, the support substrate is required, and this glass epoxy substrate 5 could not be dispensed with.

Accordingly, the use of this glass epoxy substrate 5 raised the cost. Further, since the glass epoxy substrate 5 was thick, the circuit device was thick, limiting the possibility to reduce the size, thickness and weight of the device.

Further, the glass epoxy substrate or the ceramic substrate necessarily requires a through hole forming process for connecting the electrodes on both sides. Hence, there was a problem with the long manufacturing process.

FIG. 28 shows a pattern diagram on the glass epoxy substrate, the ceramic substrate or a metal substrate. On this pattern, an IC circuit is typically made, with a transistor chip 21, an IC chip 22, a chip capacitor 23 and/or a chip resistor 24 mounted. Around this transistor chip 21 or the IC chip 22, a bonding pad 26 integral with a wire 25 is formed to electrically connect the chips 21, 22 with the bonding pad via a bonding wire 28. A wire 29 is made integrally with an external lead pad 30. These wires 25, 29 are bent through the substrate, and made slender in the IC circuit, as necessary. Accordingly, this slender wire has smaller contact area with the substrate, leading to exfoliation or curvature of the wire. The bonding pad 26 is classified into a bonding pad for power and a bonding pad for small signal. Particularly, the bonding pad for small signal has a small bonding area, which caused a film exfoliation.

Further, an external lead is fixed to an external lead pad 30. There was a problem that the external lead pad might be exfoliated due to an external force applied to the external lead.

SUMMARY OF THE INVENTION

The present invention intends to manufacture a reliable and accurate circuit device easily.

The present invention has been achieved in the light of the above-mentioned problems, and its object is to provide a method for manufacturing a circuit device, comprising, forming a conductive path patterned in a predetermined shape by patterning a surface layer of a plate, electrically connecting a desired circuit element with said desired conductive path, coating said circuit element and said conductive path with an insulating resin, and exposing said conductive path by removing said plate from an opposite surface of the conductive path.

According to the above method, at bonding step, since bonding region of said conductive path has high regidity and can be kept to be at original position, bonding reliability is very high. Further at molding step, since bonding region of said conductive path also has high regidity and can be kept to be at original position, short circuit can be suppressed efficiently.

According to the above method, positioning accuracy is improved and an accurate and reliable circuit board can be obtained.

For example, as a starting material, conductive material which mainly includes copper, copper foil is used, sheet resistance is smaller and wiring resistance can bee reduced in comparison with a film formed by plating. Further since copper foil is normally formed by extension process under pressure, even if there is difference of thermal expansion coefficient, it is difficult to cause a crack and bonding characteristic can be improved. In comparison with that, in the case that plating film is used, since plating film is grown in orientation with Z axis, it is weak for extension stress to z direction. Therefore plating film has a disadvantage, that crack is easy to be generated by extension stress for face direction and bonding characteristic is bad.

The present invention has been achieved in the light of the above-mentioned problems, and its object is to provide a method for manufacturing a circuit device, comprising, supporting a conductive path patterned in a predetermined shape and having a curved lateral face with a conductive foil, electrically connecting and fixing a desired circuit element on said desired conductive path, coating said circuit element and said conductive path with an insulating resin, and removing said conductive foil excluding at least a portion corresponding to said conductive path.

With this manufacturing method, the through hole can be dispensed with, the effective use of the conductive foil is made to serve as the support substrate and the conductive path, with the minimum number of components, the conductive path being prevented from slipping off the insulating resin.

Further according to the method, since sufficient bonding area can be secured and resin invades between the conductive paths, short circuit can be suppressed.

For example in the case that material mainly includes copper, such as a copper foil, is used as a starting material, the side edges are covered with thin oxide film, such as $Cu_2O, CuO$, is formed uniformly. In the case that the side edges are curved, the surface area is especially large, chemical bonding ability with epoxy resin is very good. Therefore adherence of conductive path with resin is highly improved.

According to a third aspect of the invention, there is provided a method for manufacturing a circuit device, comprising the steps of, preparing a laminated conductive foil with a second conductive foil laminated on the back face of a first conductive foil, forming a first conductive path of curved structure on the lateral face by forming a trench in said first conductive foil excluding at least a region for the conductive path;

electrically connecting and fixing a desired circuit device on said desired first conductive path;

coating and molding said circuit device and said first conductive path with an insulating resin to be filled into said trench; and removing said second conductive foil at a portion corresponding to said trench and forming a second conductive path on the back face of said first conductive path.

The second conductive foil is utilized as an etching stopper in forming the first conductive path, and prevents the first conductive path from breaking up. And it is used as the second conductive path ultimately. The insulating resin filled into the trench supports the conductive path integrally to prevent slippage of the conductive path. Of course, the through hole can be also dispensed with.

According to a fourth aspect of the invention, there is provided a method for manufacturing a circuit device, comprising the steps of, preparing a laminated conductive foil with a second conductive foil laminated on the back face of a first conductive foil, forming a corrosion resistant conductive coat on at least a region which becomes a conductive path on the surface of said first conductive foil, forming a first conductive path of curved structure on the lateral face by forming a trench in said conductive foil excluding at least a region for the conductive path, fixing a circuit element on said desired first conductive path, forming connecting means for electrically connecting an electrode of said circuit element with said desired first conductive path, coating and molding said circuit element, said connecting means and said first conductive path with an insulating resin to be filled into said trench, and fitting said conductive path and said insulating resin, and removing said second conductive foil which is not provided with said trench, and forming a second conductive path on the back face of said first conductive path.

The second conductive foil is utilized as an etching stopper in forming the first conductive path, and prevents the first conductive path from breaking up. And it is used as the second conductive path ultimately. The use of the conductive coat forms a visor on the surface of the conductive path. Due to the insulating resin covering this visor and filled into the trench, the conductive path is prevented from slipping. Of course, the through hole can be also dispensed with.

According to a fifth aspect of the invention, there is provided a method for manufacturing a circuit device, comprising the steps of, preparing a laminated conductive foil with a second conductive foil laminated on the back face of a first conductive foil, forming a conductive path of curved structure on the lateral face by forming a trench in said first conductive foil excluding at least a region for the conductive path, fixing a circuit element on said desired conductive path, forming connecting means for electrically connecting an electrode of said circuit element with said desired first conductive path, coating and molding said circuit element, said connecting means and said first conductive path with an insulating resin to be filled into said trench, and fitting said first conductive path and said insulating resin, removing said first conductive foil which is not provided with said trench, and forming a second conductive path on the back face of said first conductive path, and severing said insulating resin for separation into individual circuit devices.

According to a sixth aspect of the invention, there is provided a method for manufacturing a circuit device, comprising the steps of, preparing a laminated conductive foil with a second conductive foil laminated on the back face of a first conductive foil, forming a corrosion resistant conductive coat on at least a region which becomes a conductive path on the surface of said first conductive foil, forming a conductive path of curved structure on the lateral face by forming a trench in said first conductive foil excluding at least a region for the first conductive path, fixing a circuit element on said desired first conductive path, forming connecting means for electrically connecting an electrode of said circuit element with said desired first conductive path, coating and molding said circuit element with an insulating resin to be filled into said trench, and fitting said first conductive path and said insulating resin, removing said second conductive foil which is not provided with said trench, and forming a second conductive path on the back face of said first conductive path, and severing said insulating resin for separation into individual circuit devices.

BRIEF DESCRIPTION OF THE DRAWINGS

FIG. 1 is a view for explaining a circuit device according to the present invention.
FIG. 3 is a view for explaining a method for manufacturing the circuit device of the invention.
FIG. 4 is a view for explaining the method for manufacturing the circuit device of the invention.
FIG. 5 is a view for explaining the method for manufacturing the circuit device of the invention.
FIG. 6 is a view for explaining the method for manufacturing the circuit device of the invention.
FIG. 7 is a view for explaining the method for manufacturing circuit device of the invention.
FIG. 8 is a view for explaining the circuit device of the invention.
FIG. 9 is a view for explaining the method for manufacturing the circuit device of the invention.
FIG. 10 is a view for explaining the method for manufacturing the circuit device of the invention.
FIG. 11 is a view for explaining the method for manufacturing the circuit device of the invention.
FIG. 12 is a view for explaining the method for manufacturing the circuit device of the invention.
FIG. 13 is a view for explaining the method for manufacturing the circuit device of the invention.
FIG. 14 is a view for explaining the method for manufacturing the circuit device of the invention.
FIG. 15 is a view for explaining the method for manufacturing the circuit device of the invention.
FIG. 16 is a view for explaining the method for manufacturing the circuit device of the invention.
FIG. 17 is a view for explaining the circuit device of the invention.
FIG. 18 is a view for explaining the method for manufacturing e circuit device of the invention.
FIG. 19 is a view for explaining the method for manufacturing the circuit device of the invention.
FIG. 20 is a view for explaining the method for manufacturing the circuit device of the invention.
FIG. 21 is a view for explaining a circuit device of the invention.
FIG. 22 is a view for explaining a circuit device of the invention.

FIG. 23 is a view for explaining a way of mounting the circuit device of the invention.

FIG. 24 is a view for explaining a mounting structure of the conventional circuit device.

FIG. 25 is a view for explaining the conventional circuit device.

FIG. 26 is a view for explaining a method for manufacturing the conventional circuit device.

FIG. 27 is a view for explaining the method for manufacturing the conventional circuit device and the circuit device of the present invention.

FIG. 28 is pattern diagram of an IC circuit which is applicable to the conventional circuit device and the circuit device of the invention.

[FIG. 29]

FIG. 29 is a diagram for explaining the relation between the semiconductor manufacturer and the set maker.

DESCRIPTION OF THE PREFERRED EMBODIMENTS

First Embodiment for Circuit Device

Figure 1A:
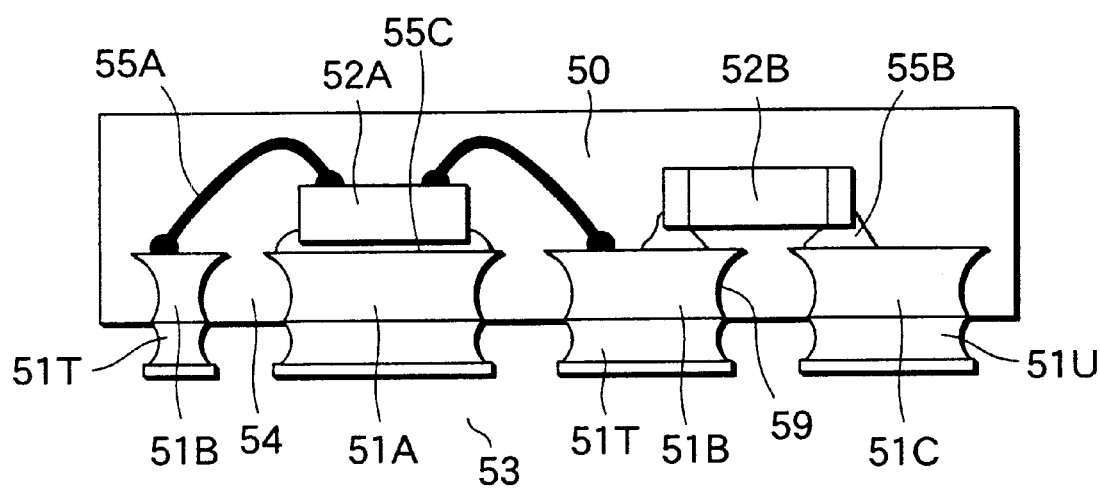
[FIG. 1]

Referring to FIG. 1, a circuit device of the present invention will be first described below in connection with its structure.

FIG. 1 shows a circuit device 53 in which a conductive path 51 is buried into an insulating resin 50, and a circuit element 52 is fixed on said conductive path 51 supported by the insulating resin 50. The lateral face of the conductive path 51 has a curved structure 59.

This circuit device 53 is mainly composed of the circuit elements 52A, 52B, the first conductive paths 51A to 51C, and the insulating resin 50 into which the first conductive paths 51A to 51C are buried. Between the first conductive paths 51A to 51C, a trench 54 is filled with the insulating resin 50. And the insulating resin 50 supports the conductive path 51 of the curved structure 59.

Furthermore, the conductive path 51 is substantially laminated. Namely, a first conductive path 51A and a second conductive path 51S, a first conductive path 51B and a second conductive path 51T, and a first conductive path 51C and a second conductive path 51U are laminated.

The insulating resin may be a thermosetting resin, such as epoxy resin, or a thermoplastic resin, such as polyimide resin and polyphenylene sulfide. Also, the insulating resin may be any of the resins as far as they can be set by the use of a mold, or coated by dipping or application.

The laminated conductive foil has a structure, for example, in which the first conductive path on the upper layer is made of Cu (or Al) as the main constituent, and the second conductive path on the lower layer is made of Al (or Cu) as the main constituent. The upper layer and lower layer can be constituted by a same material.

Connecting means for the circuit elements 52 may be a bonding wire 55A, a conductive ball made of brazing material, an oblate conductive ball, a brazing material 55B such as solder, a conductive paste 55C such as Ag paste, a conductive coat, or an anisotropic conductive resin. These connecting means may be selected depending on the kind of the circuit element 52, and the mounting mode of the circuit element 52. For example, for the bare semiconductor element, a metallic bonding wire is selected to connect the electrode on the surface and the conductive path 51. For the CSP or flip chip, a solder ball or solder bump is selected. For the chip resistor or chip capacitor, the solder 55B is selected. The circuit element packaged, for example, a BGA or package type semiconductor device, can be mounted in the conductive path 51 without causing any problem, in which the connecting means may be solder.

To fix the circuit element with the conductive path 51A, an insulating adhesive is selected if the electrical connection is unnecessary. If the electrical connection is required, the conductive coat is adopted. Herein, at least one layer of conductive coat may be required.

The conductive coat materials may be Ni, Ag, Au, Pt or Pd, which is coated by evaporation, sputtering or CVD under low vacuum or high vacuum, plating, or sintering the conductive paste.

For example, Ag is adherent to Au, as well as the brazing material. Hence, if an Au coat is applied on the back face of the chip, the chip can be directly subjected to thermocompression bonding with an Ag coat, Au coat or solder coat on the conductive path 51A, or the chip can be fixed via the brazing material such as solder. Herein, such conductive coat may be formed on the uppermost layer of the conductive coats laminated. For example, on the conductive path 51A of Cu, two layers of Ni coat and Au coat may be applied in due order, three layers of Ni coat, Cu coat and solder coat applied in due order, or two layers of Ag coat and Ni coat applied in due order. Note that a number of other kinds of conductive coat or lamination structures are considered, but omitted here.

This circuit device has the insulating resin 50 for covering the conductive path 51 and filled into the trench 54 between the first conductive paths 51A to 51C to support them integrally.

The interval between these conductive paths 51 is the trench 54 where the insulating resin 50 is filled, and has the merit of effecting insulation between them.

The interval between the conductive paths 51A to 51C with the curved structure 59 is the trench 54 where the insulating resin 50 is filled, and the merit of preventing the conductive paths 51A to 51C from slipping and effecting insulation between them.

This circuit device has the insulating resin 50 for covering the circuit elements 52 to be filled into the trench 54 between the conductive paths 51A to 51C, and supporting the conductive paths integrally with the second conductive paths 51S to 51U exposed.

Figure 25:
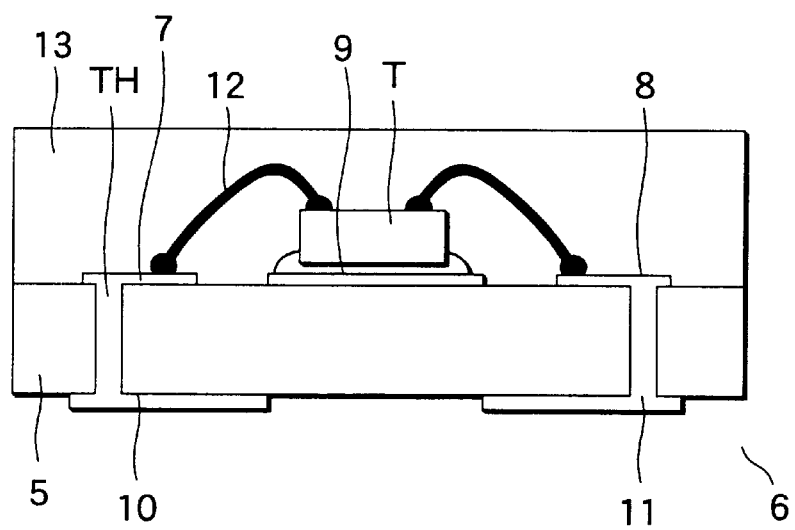
[FIG. 25]
Figure 26A:
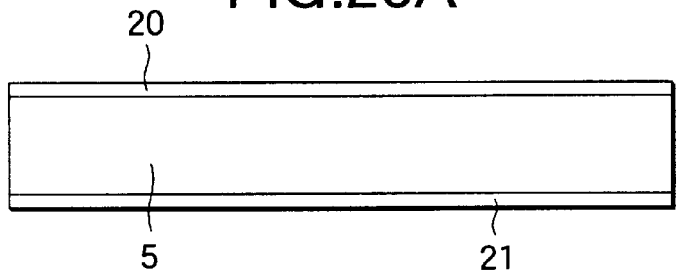
[FIG. 26]
Figure 26B:
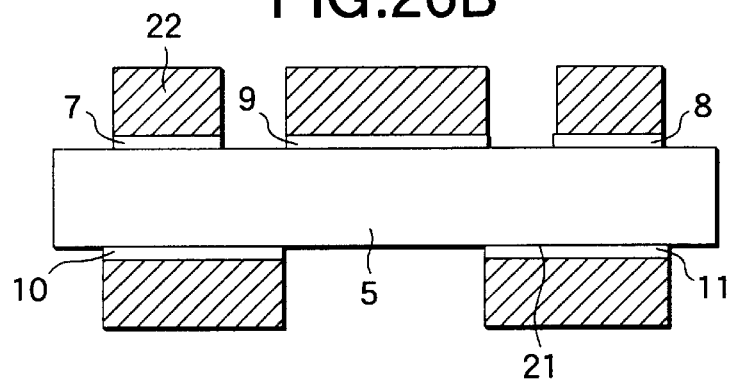
Figure 26C:
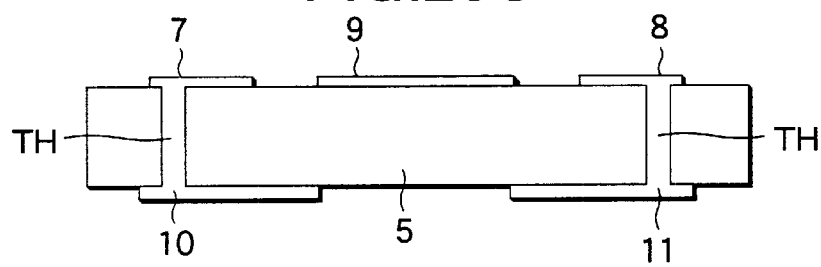
Figure 26D:
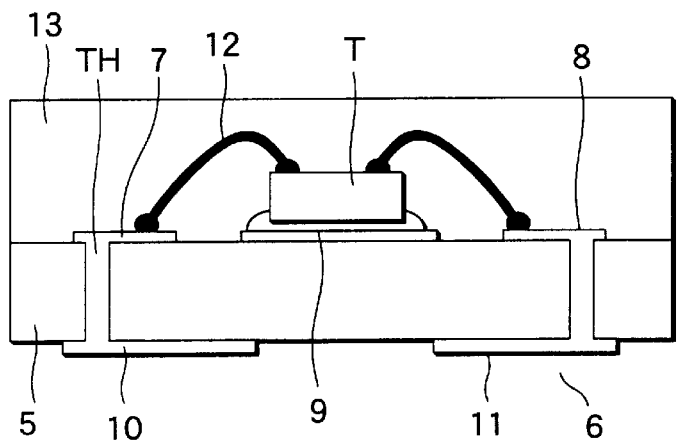

By exposing the second conductive paths 51S to 51U, the back face of the second conductive paths can be connected with the external. Hence, there is a feature that the conventional through hole of FIG. 25 can be dispensed with.

In the case where the circuit elements are directly fixed via the conductive coat made of brazing material, Au, or Ag, the heat developed by the circuit elements or the conductive path 52A can be transferred to the mounting substrate via the conductive path 51A. Particularly by heat release, this circuit element is effective for the semiconductor chips which can improve the characteristics such as increased drive current.

Figure 1B:
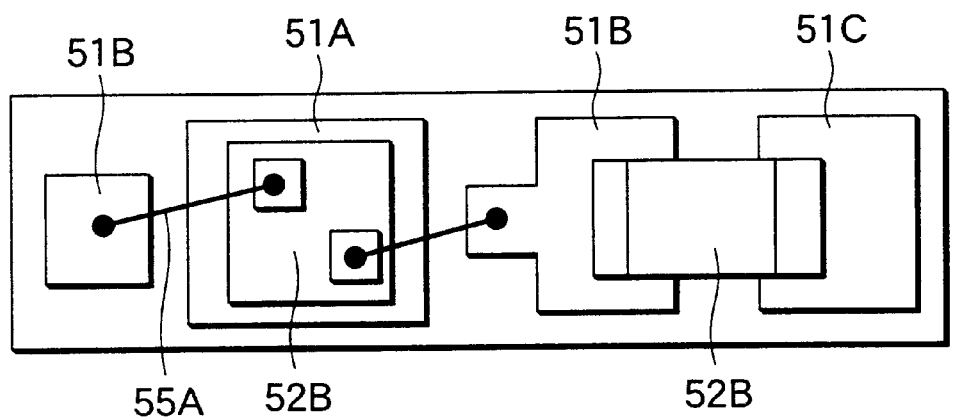
Figure 28:
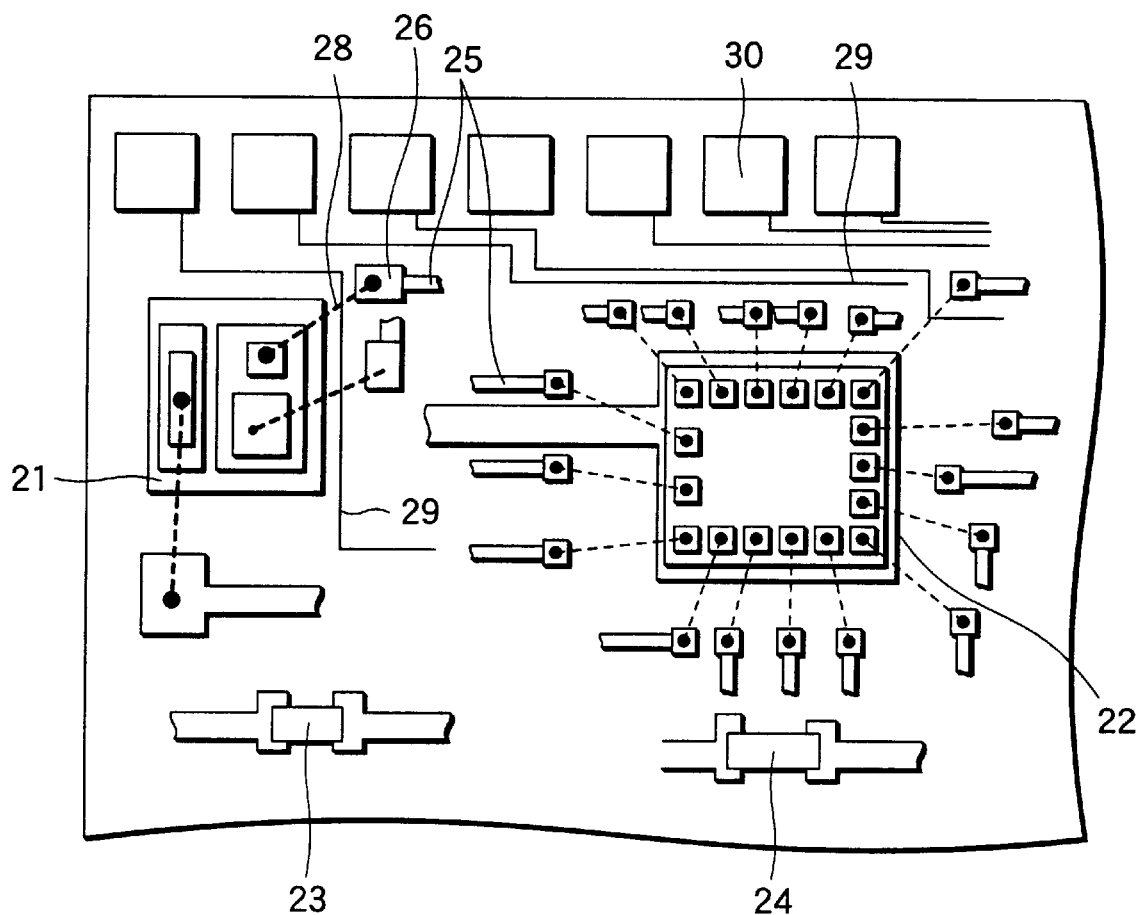
[FIG. 28]

In FIG. 1, a plurality of circuit elements constitute an IC circuit, and the conductive paths for connection between the circuit elements are wired, with a land configuration as shown in FIG. 1B. However, the practical configuration is more complex as shown in FIGS. 2 and 28.

Second Embodiment for Circuit Element

A circuit element 53 of FIG. 2 will be described below.

This circuit element has substantially the same structure as that of FIG. 1, except that the interconnects L1 to L3 are formed as the conductive path. Accordingly, the interconnects L1 to L3 will be described below. As described before, there are a wide variety of IC circuits from a small-scale circuit to a large-scale circuit.

Figure 2A:
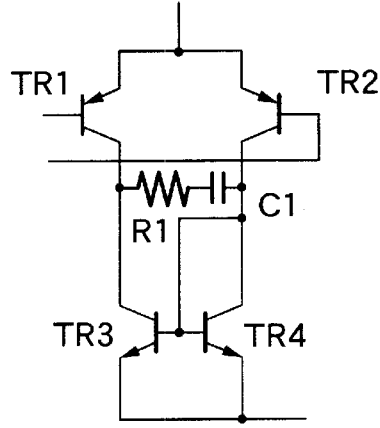
[FIG. 2]
FIG. 2 a view for explaining the circuit device of the invention.

For the convenience of the drawings, the small-scale circuit is only shown in FIG. 2A. This circuit is most applicable to an audio amplifying circuit having a difference amplifying circuit and a current mirror circuit connected. The difference amplifying circuit is constituted of TR1 and TR2, and the current mirror circuit is constituted of TR3 and TR4, as shown in FIG. 2A.

Figure 2B:
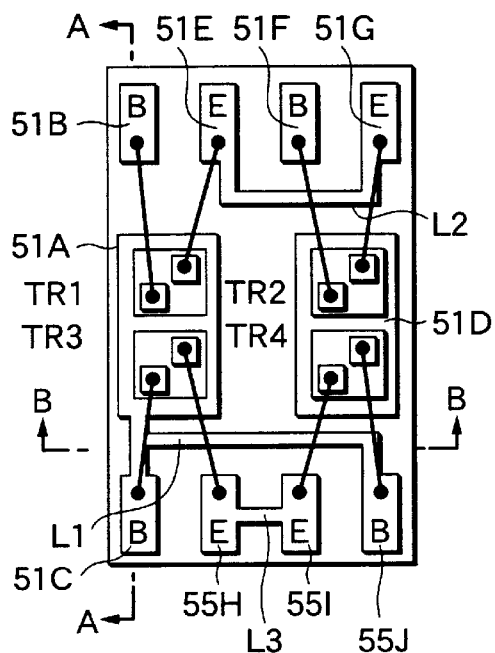
Figure 2C:
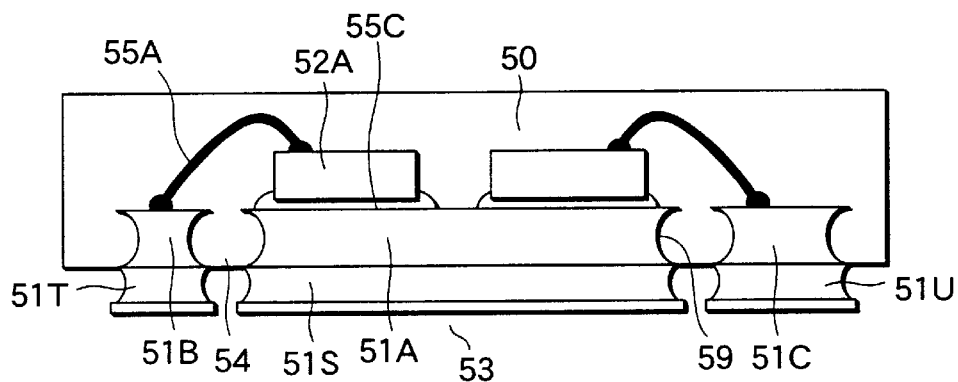
Figure 2D:
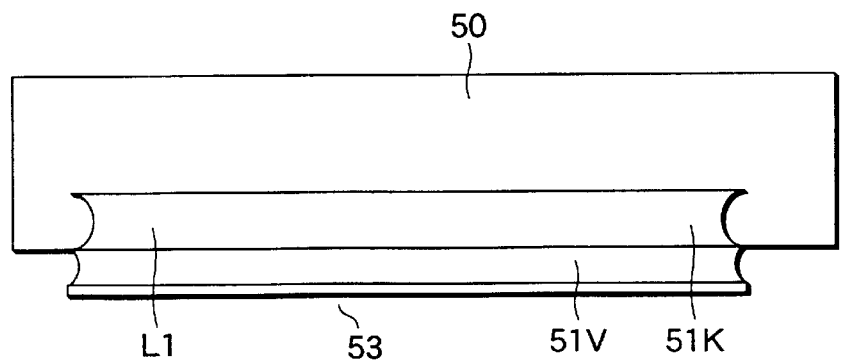

FIG. 2B is a plan view of the circuit element to which the circuit of FIG. 2A is applied. FIG. 2C is a cross-sectional view taken along the line A—A in FIG. 2B. FIG. 2D is a cross-sectional view taken along the line B—B. To the left of FIG. 2B, a die pad 51A for mounting the TR1 and TR3 is provided. To the right of FIG. 2B, a die pad 51D for mounting the TR2 and TR4 is provided. On the upper side of the die pads 51A, 51D, there are provided the electrodes for external connection 51B, 51E to 51G, and on the lower side thereof, there are provided the electrodes for external connection 51C, 51H to 51J. Note that reference signs B, E denote a base electrode and an emitter electrode, respectively. Since a TR1 emitter and a TR2 emitter are commonly connected, an interconnect L2 is formed integrally with the electrodes 51E, 51G. Also, since a TR3 base and a TR4 base, as well as a TR3 emitter and a TR4 emitter are commonly connected, an interconnect L1 is formed integrally with the electrodes 51C, 55J, and an interconnect L3 is formed integrally with the electrodes 55H, 55I.

There is a feature that the interconnects L1 to L3 correspond to the interconnects 25 and 29 in FIG. 28. These interconnects are different depending on the degree of integration of this circuit element, and have the width as narrow as 25 μm or more. Note that this width of 25 μm is a numerical value taken when the wet etching is used. If the dry etching is used, its width can be narrower.

As will be clear from FIG. 2D, a first conductive path 51K constituting the interconnect L1 is buried into the insulating resin 50, and has a lateral face of curved structure which is supported by the insulating resin 50. In other words, the interconnect is buried into the insulating resin 50. Hence, the wires can be prevented from slipping or warping, unlike the wires simply pasted on the support substrate as shown in FIGS. 24 to 28. Particularly, since the lateral face of the first conductive path is a rough face with curved structure, and the visor is formed on the surface of the first conductive path, there is an anchor effect to prevent the conductive path from slipping off the insulating resin, as will be apparent from a manufacturing method hereinafter described. The structure of visor will be described later in FIG. 8.

The electrodes 51B, 51C, 551E to 51J for external connection are buried into the insulating resin, as described previously. Therefore, even if an external force is applied via an external lead secured therein, the electrodes are unlikely to be peeled. Herein, a resistor R1 and a capacitor C1 are omitted, but may be mounted on the first conductive path. As will be described in the later embodiment of the mounting structure, they may be mounted on the back face of this circuit element, or externally mounted on a printed circuit board.

Third Embodiment for Circuit Device

Figure 8:
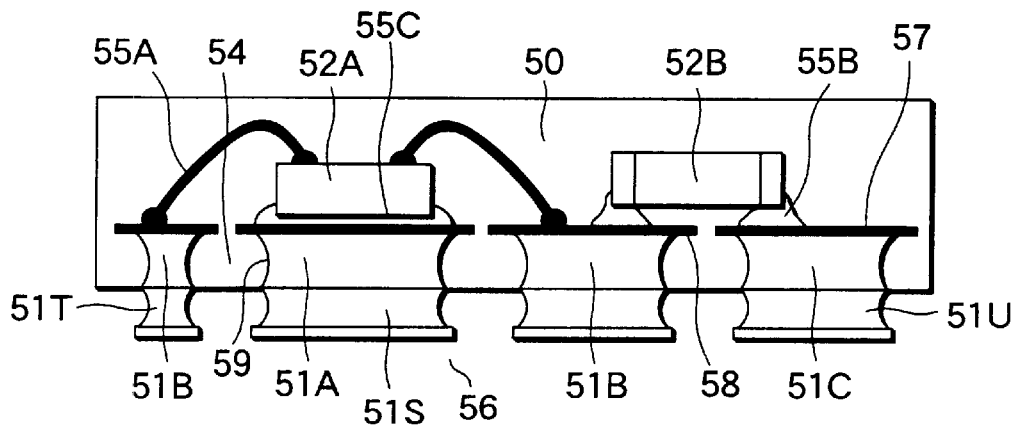
[FIG. 8]

A circuit device of FIG. 8 will be described below.

This circuit device has substantially the same structure of FIG. 1 or 2, except that a conductive coat 57 is formed on the surface of the first conductive paths 51A to 51C. Herein, the conductive coat 57 will be mainly described below.

A first feature is to provide an anchor effect owing to a second material which is different from a material of the first conductive paths 51A to 51C (hereinafter referred to as a first material). Since a visor 58 is formed by the second material, and applied with the first conductive paths 51A to 51C which are buried into the insulating resin 50, the anchor effect is developed to prevent the first conductive path 51 from slipping.

In the present invention, both the curved structure 59 and the visor 58 develops the double anchor effect to suppress the slippage of the first conductive paths 51A to 51C.

In the above three embodiments, there has been described the circuit device having a plurality of circuit elements mounted and the wires included to constitute the circuit.

Figure 21:
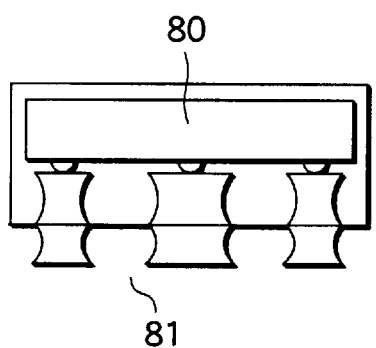
[FIG. 21]
Figure 22:
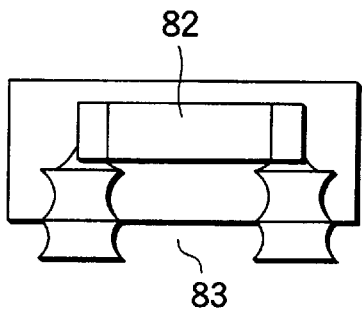
[FIG. 22]

However, the present invention is also applicable to a circuit device which is constituted of one circuit element (semiconductor device or passive element) sealed therein, as shown in FIGS. 21 and 22. FIG. 21 shows the circuit device in which a face down element 80 such as CSP or flip chip is mounted. FIG. 22 shows the circuit device in which a passive element 82 such as a chip resistor or chip capacitor is sealed. Further, the bonding wire may be provided between two conductive paths and sealed therein. This is usable as a fuse.

First Embodiment for a Manufacturing Method of a Circuit Device

Referring to FIGS. 3 to 7 and FIG. 1, a manufacturing method of a circuit device 53 will be described below. Firstly, as shown in FIG. 3a sheet conductive foil 60 is prepared. This conductive foil 60 is composed of a first conductive foil 60A and a second conductive foil 60B which are laminated.

It is important here that both conductive foils can be selectively etched and the value of resistance is low. To increase the degree of integration, it is also important that a fine pattern can be formed in etching. For example, when the first conductive foil 60A is patterned by etching, the second conductive foil 60B acts as an etching stopper. Also, when the second conductive foil 60B is patterned as the second conductive path by etching, the first conductive foil 60A is not etched.

For example, the low resistive materials may include Cu, Al, Au, Ag or Pt. In view of the cost and workability, Cu and Al are preferable. Cu is the most preferable material because it has low resistance and is cheap, and can be subjected to wet etching. Accordingly, to pursue the low cost and low resistance value, it is preferable that Cu is used as the first conductive foil 60A. However, Cu is less liable to dry etching. On the other hand, Al is mostly used for the wires of semiconductor IC, and can be etched by anisotropic etching. Because the lateral face can be etched directly, the higher density of wire can be attained. Accordingly, to pursue the finer pattern, Al may be adopted as the first conductive foil 60A.

For example, when Cu is adopted as the first conductive foil, an Al foil is prepared. Cu is plated on the surface of this Al foil, so that the thickness of Cu can be adjusted to have the finer pattern. If the thickness of Cu is reduced, the etching in the traversal direction does not proceed, so that the finer pattern can be made. When Al is used as the first conductive foil 60A, a Cu foil is prepared. On this Cu foil, Al is made by deposition or sputtering, enabling the film thickness of Al to be adjusted. Further, since the anisotropic etching can be effected by a Cl2 gas or a mixture of Cl2 gas and BCl3 gas, the finer pattern can be made.

The laminated conductive foil 60 is adopted for explanation below in which the second conductive foil 60B is an Al foil having a thickness of 10 $\mu$m to 300 $\mu$m, and the first conductive foil 60A plated with Cu several $\mu$m to about 20 $\mu$m in thickness is laid on the second conductive foil 60B.

The sheet laminated conductive foil 60 is rolled in a desired width, and may be carried to each process as will be described later, or may be cut in a predetermined size, the cut conductive foils being carried to each process.

Subsequently, there are a step of removing the first conductive foil 60A, except for at least a region which becomes the first conductive paths 51A to 51C, a step of mounting the circuit elements 52 on the first conductive path 60A, and a step of coating the insulating resin 50 in a trench 61 and the laminated conductive foil 60 to seal the circuit elements.

Figure 4:
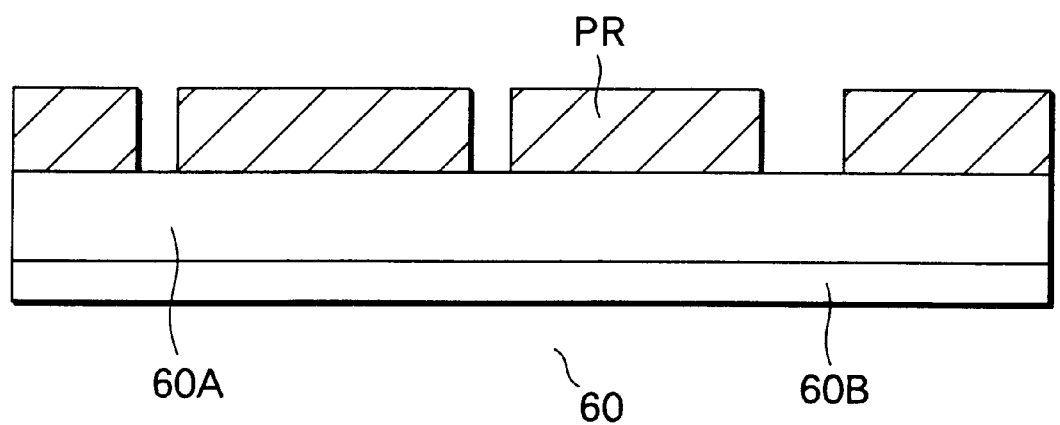
[FIG. 4]
Figure 5A:
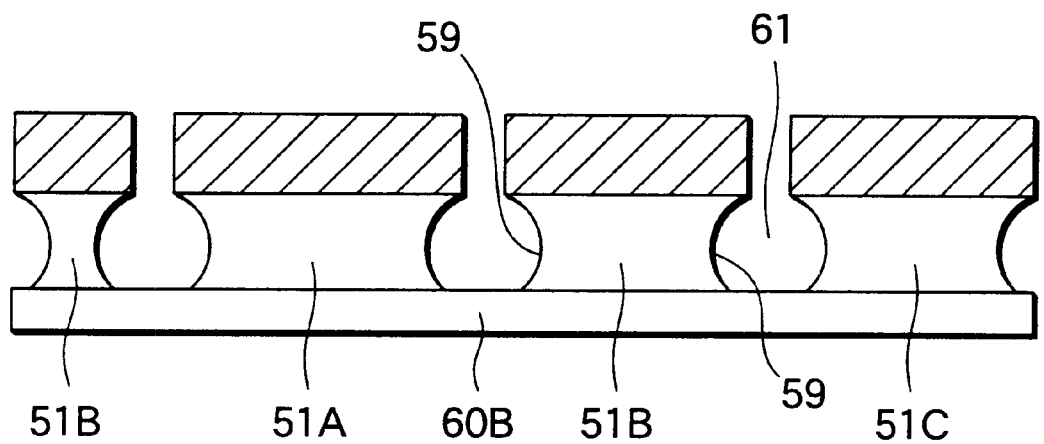
[FIG. 5]

Firstly, a photo-resist (PR) (etching resistant mask) is applied on the first conductive foil 60A of the Cu foil 60, and patterned to expose the first conductive foil 60A excluding the region which becomes the first conductive paths 51A to 51C, as shown in FIG. 4. And etching is performed via the photo-resist PR, as shown in FIG. 5A.

This manufacturing method has a feature that the wet etching or dry etching is performed isotropically, the lateral face being a rough face and curved.

In the wet etching, etchant may be ferric chloride or cupric chloride. The conductive foil may be dipped in this etchant, or this etchant may be showered. Herein, the wet etching is typically made isotropically, so that the lateral face has the curved structure. When ferric chloride is used as the etchant, Al does not act as an etching stopper, because Al has a higher etching rate than Cu. Therefore, when the first conductive foil 60A is patterned as the first conductive paths 51A to 51C, the thickness of the second conductive foil 60B is needed to be increased, so that the second conductive foil 60B of Al can support integrally this first conductive paths 51A to 51C. In this case, as shown by dotted line, trench is formed in not only the first conductive foil 60A but also the second conductive foil 60B.

In the dry etching, the anisotropic etching or isotropic etching can be made. At present, it is said that Cu can not be removed by reactive ion etching. Cu can be removed by sputtering. The anisotropic etching or isotropic etching can be effected, depending on the sputtering or etching conditions. The lateral face of the trench 61 has the curved structure by etching isotropically.

Herein, it is preferable to use an etchant in which Cu is etched and Al is not etched, and in which Al acts as etching stopper.

Figure 5B:
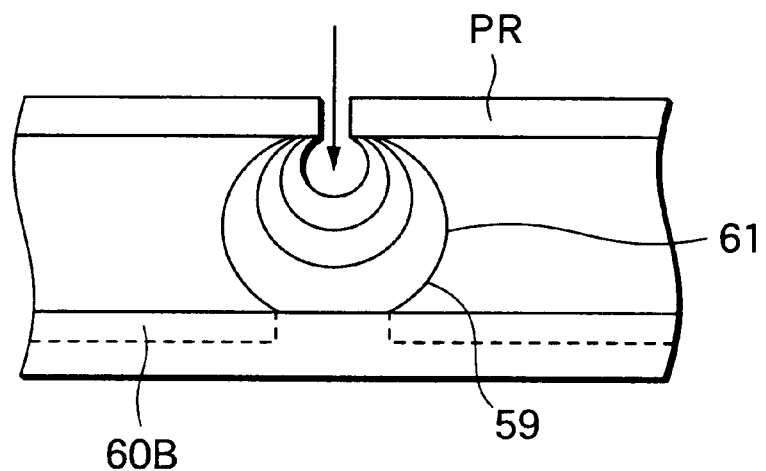

Particularly as shown in FIG. 5B, etching in the transversal direction is difficult to proceed directly under the photo-resist PR as the etching mask, but is gradually made in a deeper portion of the photo-resist PR in the transversal direction. As shown in the figure, with reference to a certain position on the lateral face of the trench 61, the size of aperture corresponding to its position is smaller with increased height, to taper inversely, resulting in the anchor structure. By showering, the etching proceeds in the depth direction, but is suppressed in the transversal direction, so that this anchor structure becomes remarkable.

In FIG. 4, a conductive material which is resistant to the etching liquid may be selectively coated, instead of the photo-resist. By coating selectively this conductive material on a portion serving as the conductive path, this conductive material becomes an etching protective film, so that the trench can be etched without the use of the resist. The conductive materials may include Ni, Ag, Au, Pt and Pd. These corrosion resistant conductive materials have a feature of being readily available as the die pad or bonding pad.

For example, Ag can be bonded with Au and the brazing material. Hence, if Au has been coated on the back face of chip, the thermocompression bonding of chip can be effected with the Ag on the conductive coat 51, or the chip can be fixed via the brazing material such as solder. Since the Ag bonding wire can be bonded to the conductive coat of Ag, the wire bonding is allowed. Accordingly, there is provided a merit that these conductive coats can be directly utilized as the die pad and the bonding pad.

Figure 6:
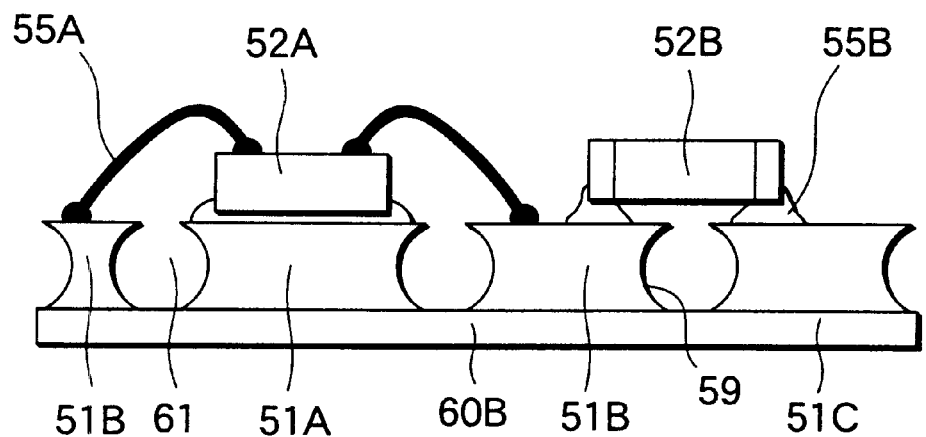
[FIG. 6]

Subsequently, there is a step of connecting electrically the circuit elements 52A, 52B to the first conductive paths 51A to 51C formed with the trench 61, as shown in FIG. 6.

The circuit elements 52 include the semiconductor device 52A such as a transistor, a diode and an IC chip, and the passive element 52B such as a chip capacitor and a chip resistor. These elements may be bare chips or sealed chips. Though being thick, a face down element (also referred to as a flip chip) such as CSP or BGA can be mounted.

Herein, the bare transistor chip 52A is die bonded to the first conductive path 51A. Also, the emitter electrode and the first conductive path 51B, as well the base electrode and the first conductive path 51B, are connected via the bonding wire 55A which has been fixed by ball bonding with thermocompression, or wedge bonding with ultrasonic wave. The chip capacitor or the passive element is mounted between the first conductive paths 51B and 51C via the brazing material such as solder or the conductive paste 55B such as Ag paste.

When the pattern of FIG. 28 is applied in this embodiment, the bonding pad 26, which is small in size, is provided integrally with the second conductive foil 60B, as shown in FIG. 5. Hence, there is a merit that the energy of bonding tool can be transferred, with greater bonding ability. In cutting the bonding wire after bonding, the bonding wire may be pull-cut. Then, since the bonding pad is integrated with the second conductive foil 60B, floating of the bonding pad can be suppressed, leading to better pull-cut ability.

Figure 7:
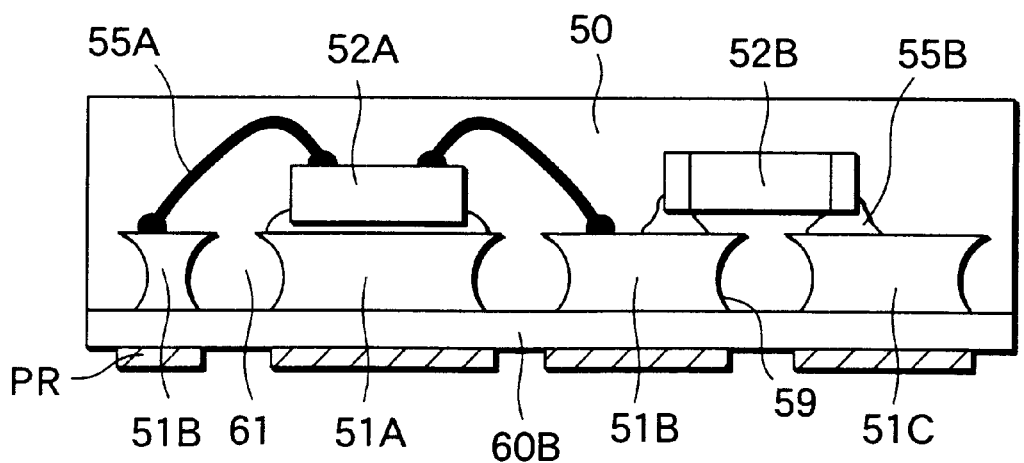
[FIG. 7]

Further, there is a step of attaching the insulating resin 50 onto the first conductive paths 51A to 51C and the curved trench 61, as shown in FIG. 7. This can be performed by transfer molding, injection molding, dipping or application. The resin materials include a thermosetting resin such as epoxy resin for which the transfer molding is suitable, and a thermoplastic resin such as polyimide resin and polyphenylene sulfide for which the injection molding is usable.

In this embodiment, the insulating resin 50 applied on the surface of the conductive foil 60 is adjusted so as to cover the thickness of about 100$\mu$m from the top portion of the circuit element (top of the bonding wire 55A). This thickness may be increased or decreased in consideration of the strength.

The second conductive foil 60B which is held in the sheet state is not divided like the first conductive paths 51A to 51C. Accordingly, it can be treated integrally as one sheet laminated conductive foil 60. It has a feature of the easy operation of carrying or mounting it onto the mold, when molding the insulating resin.

Further, since the insulating resin 50 is fitted into the trench 61 having the curved structure, there occurs the anchor effect in this region to prevent the insulating resin 50 from being peeled, and the conductive paths 51 from slipping off the insulating resin 50, the conductive paths 51 being separated at the later step.

Before coating this insulating resin 50, the silicone resin may be potted to protect the semiconductor chip or bonding wire, for example.

Subsequently, there is a step of removing chemically and/or physically the back face of the second conductive foil 60B for separation into the conductive paths 51. This step of removing can be effected by polishing, grinding, etching, or metal evaporation with laser.

Herein, an alkali solution of sodium hydroxide is used for etching. The sodium hydroxide can etch Al but not CU, and therefore does not etch the first conductive paths 51A to 51C.

As a result, the second conductive paths 51S to 51U are exposed from the insulating resin 50. And the bottom of the trench 61 is exposed, resulting in the trench 54 as shown in FIG. 1. The entire second conductive foil 60B may be removed (see FIG. 7).

Lastly, a conductive material such as solder may be applied onto the second conductive paths 51S to 51U exposed, as required, to complete the circuit device as shown in FIG. 1.

Figure 3:
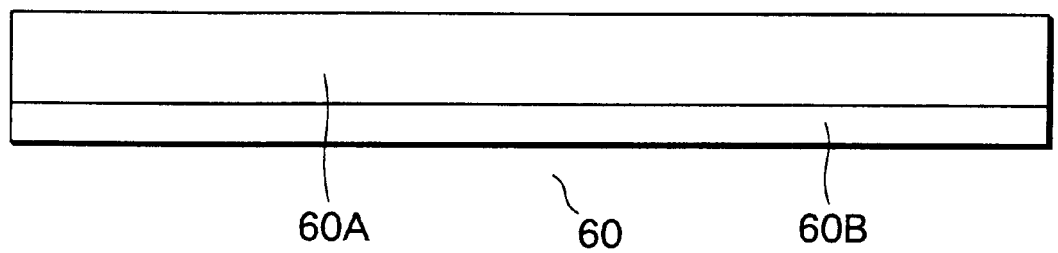
[FIG. 3]

In the case where the conductive material is coated on the back face of the conductive paths 51S to 51U, the conductive coat may be formed ahead on the back face of the conductive foil of FIG. 3. In this case, the conductive coat may be selectively applied on the portion corresponding to the conductive path. The way of coating may be by plating. This conductive coat may be a material resistant to etching.

With this manufacturing method, the transistor and the chip resistor are only mounted on the conductive paths, but may be arranged in a matrix of transistors and chip resistors, or a matrix of circuits as shown in FIG. 28. In this case, the matrix can be divided into individual units by using a dicing apparatus, as will be described later.

With this manufacturing method, the circuit device 53 can be fabricated in which the first conductive paths 51A to 51C are buried into the insulating resin 50, and the second conductive paths 51S to 51U are exposed on the back face of the insulating resin 50.

The insulating resin 50 is required to have the conductive paths 51 buried therein. There is no need of having unnecessary support substrate 5, unlike the conventional manufacturing method of FIG. 6. Accordingly, it can be manufactured with the minimum amount of material, with less cost (see FIG. 1).

Second Embodiment for a Manufacturing Method of a Circuit Device

Referring to FIGS. 3 to 7 and FIG. 1 again, a manufacturing method of the circuit device 53 will be described below. This A second embodiment is different from the previous embodiment in that the first conductive foil 60A is made of Al, and the second conductive foil 60B is made of Cu. Each of the steps is substantially the same. Accordingly, only the different points will be detailed below, and other points omitted.

This laminated conductive foil 60 may be made by laying a Cu thin film on an Al foil, or an Al thin film on a Cu foil, as described in the previous embodiment. This thin film may be made by plating, deposition, or sputtering, or prepared in a state of foil, and laminated and bonded under pressure (see FIG. 3).

Subsequently, the photo-resist PR is formed on the laminated conductive foil 60, and is left on the portions corresponding to the conductive paths (see FIG. 4).

Subsequently, the first conductive foil 60A is patterned via the photo-resist PR. In this step, an alkali solution such as sodium hydroxide is used as etchant. This sodium hydroxide etches Al but does not etch Cu. Therefore, there is no need of considering the thickness of the second conductive foil, like the previous embodiment. Accordingly, the second conductive foil 60B made of Cu can be made thinner or thicker. Due to wet etching, the lateral face is curved. If the showering is performed, it is further curved. Using a C12 gas or a mixture of BC13 and C12 gases, dry etching can be effected isotropically (see FIG. 5).

Subsequently, there is a step of mounting the circuit elements 52. Herein, if an Ag paste is applied and sintered on the surface of the first conductive paths 51A to 51C, the circuit elements can be joined with Au on the back face of the semiconductor chip. The bonding wire 55A made of Al or Au can be bonded. Ag is superior in the adhesiveness with the brazing material such as solder, and fixed via the brazing material 55B (see FIG. 6).

Subsequently, there is a step of applying the insulating resin 50. This step is exactly the same as in the previous embodiment, and not described.

Subsequently, there is a step of patterning the second conductive foil 60B. The photo-resist PR is patterned so that the portion corresponding to the second conductive path may be left. Etching is performed using an etchant such as ferric chloride, cupric chloride or sodium hydroxide. Preferably, Cu is etched, but Al is not etched by etchant (see FIG. 7).

Lastly, a conductive material such as solder is applied on the second conductive paths 51S to 51U exposed, as required. Consequently, the circuit device as shown in FIG. 1 is completed.

Ag may be used for this conductive material. In this case, Ag may be plated entirely on the back face of the second conductive foil 60B of FIG. 3, or partly plated. Ultimately, Ag provided on the back face of the second conductive paths 51S to 51U and the Cu wire on the mounting substrate can be fixed via the brazing material.

With this manufacturing method, when the first conductive foil 60A made of Ag is etched in the first conductive paths 51A to 51C, its lateral face can be curved, resulting in the anchor effect. Hence, it is possible to prevent the conductive paths from slipping.

Third Embodiment for a Manufacturing Method of a Circuit Device

Referring to FIGS. 9 to 13 and FIG. 8, a manufacturing method of a circuit device 56 having a visor will be described below. The third embodiment is substantially the same as the first embodiment (FIGS. 1 and 2), except that a conductive material 70 (hereinafter referred to as a second material) which serves as the visor is applied. The details are not described here.

Figure 9:
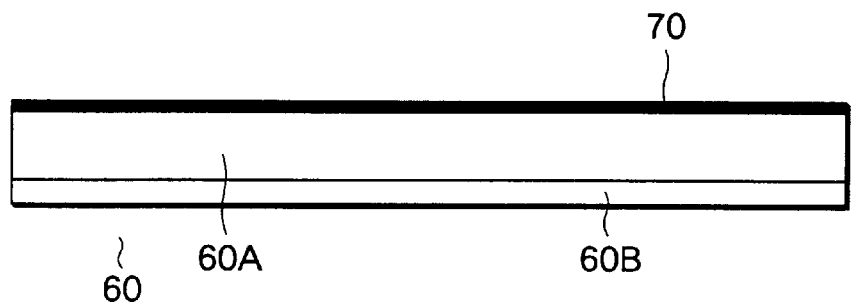
[FIG. 9]

Firstly, a laminated conductive foil 60 is prepared in which the second material 70 having a small etching rate is applied on the first conductive foil 60A made of the first material, as shown in FIG. 9.

For example, if Ni is applied on the Cu foil, Cu and Ni can be etched by ferric chloride or cupric chloride at a time, advantageously resulting in the formation of the visor 58 of Ni, due to a difference between etching rates. The bold line indicates the conductive coat 70 made of Ni, its film thickness being preferably about 1 to 10 μm. The larger film thickness of Ni can form the visor 58 more easily.

The second material may cover the first material as well as the material for selective etching. In this case, the film made of the second material is firstly patterned to cover the formed area of the first conductive paths 51A to 51C. Then, with this film as a mask, the first conductive path 60A made of the first material is etched so that the visor 58 can be formed. The second materials may include Al, Ag and Au (see FIG. 9).

Subsequently, there is a step of removing the first conductive foil 60A except for at least the region which becomes the first conductive paths 51A to 51C.

Figure 10:
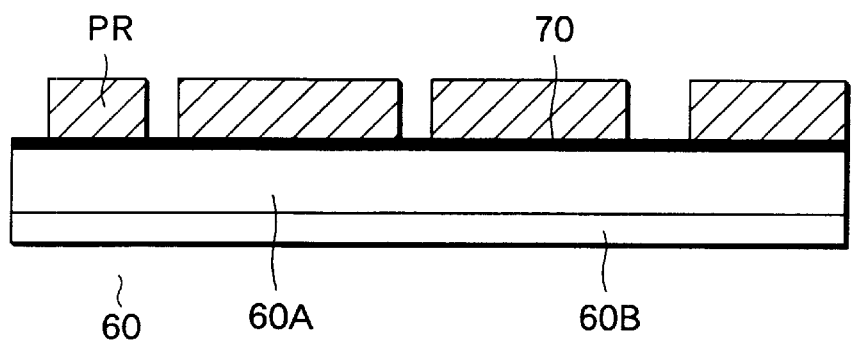
[FIG. 10]
Figure 11:
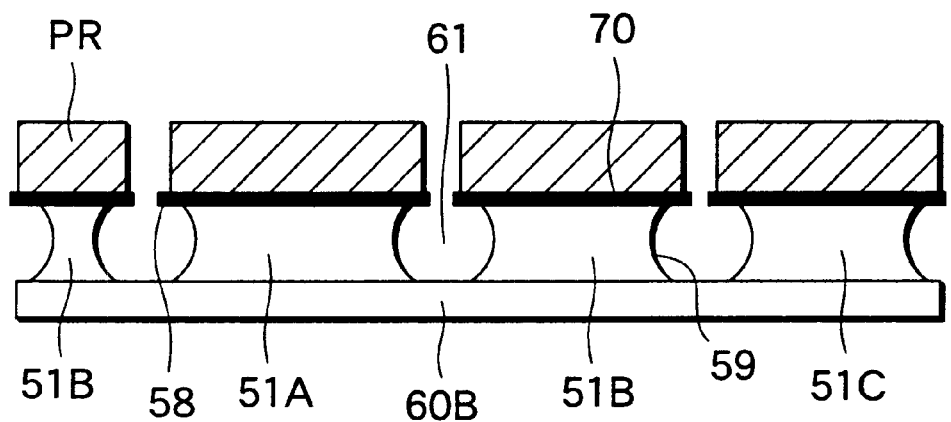
[FIG. 11]
Figure 12:
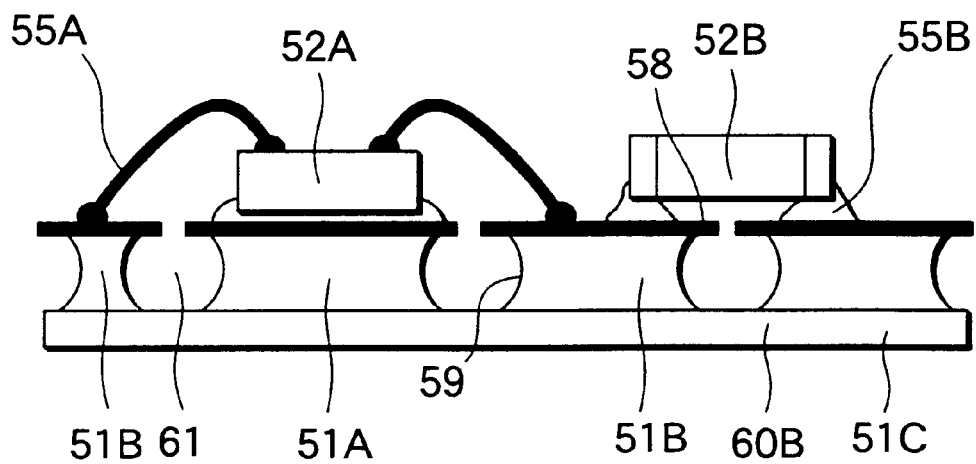
[FIG. 12]
Figure 13:
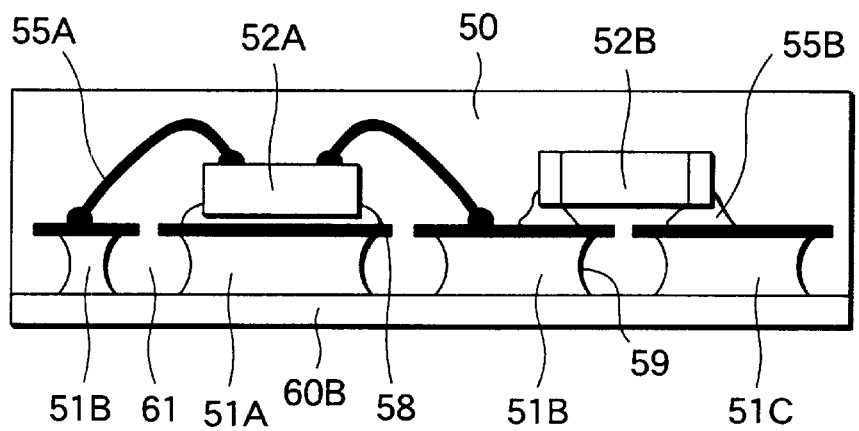
[FIG. 13]

The photo-resist PR is formed on the Ni conductive coat 70, and patterned so that the Ni conductive coat 70 may be exposed except for the region which becomes the first conductive paths 51A to 51C, as shown in FIG. 10. Then, etching is performed with the photo-resist, as shown in FIG. 11.

As described previously, if etching is performed, using an etchant such as ferric chloride or cupric chloride, the visor 58 juts out as the etching proceeds, because the Ni conductive coat 70 has a slower etching rate than the conductive foil Cu 60.

The steps of mounting the circuit elements 52 in the first conductive paths 51A to 51C with the trench 61 formed (FIG. 12), covering the insulating resin 50 over the first conductive foils 51A to 51C and the trench 61, removing the second conductive foil 60B chemically and/or physically for separation into the second conductive paths 51S to 51U (FIG. 13), and forming the conductive coat on the back face of the conductive paths to complete the circuit device (FIG. 8) are the same as those of the previous manufacturing method, and not described again.

The double anchor effect is produced by the visor 58 and the curved structure 59, and can prevent slippage and curvature of the conductive paths.

Fourth Embodiment for a Manufacturing Method of a Circuit Device

Referring to FIGS. 14 to 20, a method for manufacturing a circuit device will be described below, in which the IC circuits having the conductive paths composed of a plurality of kinds of circuit elements, wires, die pads and bonding pads are arranged like a matrix and divided into individual IC circuits after sealing. Referring to FIG. 2 and particularly a cross-sectional view of FIG. 2C, the structure will be described below. This manufacturing method is substantially the same as in the first embodiment and the second embodiment, and is simply described.

Figure 14:
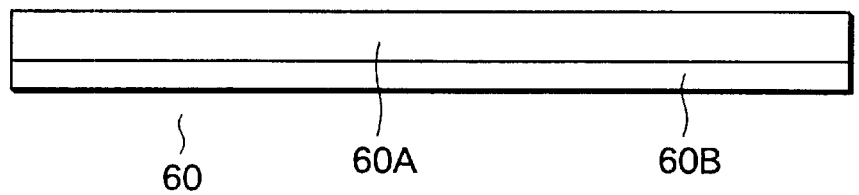
[FIG. 14]

Firstly, the sheet laminated conductive foil 60 is prepared, as shown in FIG. 14.

Figure 16:
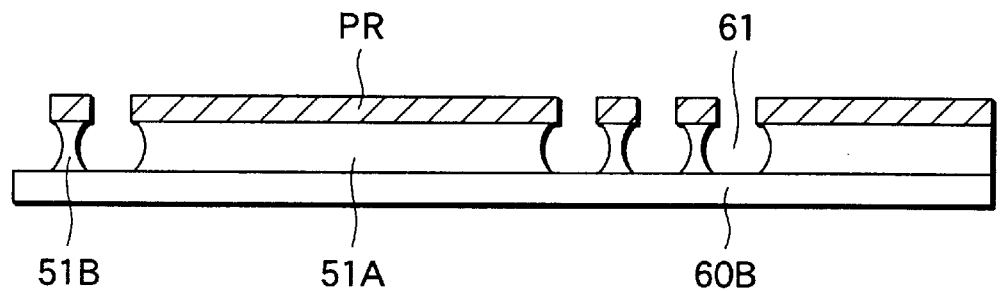
[FIG. 16]

The second conductive foil 60B is required to be thick enough to support the first conductive paths not to break off, when forming the trench 61 at the step of FIG. 16. Herein, one is Al, and the other is Cu. Laying order is out of consideration. The sheet laminated conductive foil 60 is rolled in a predetermined width, and may be carried to the later process. Or the conductive foils cut in a predetermined size may be prepared and carried to the later process.

Subsequently, there is a step of removing the first conductive foil 60A except for at least the region which becomes the first conductive paths 51A to 51C.

Figure 15:
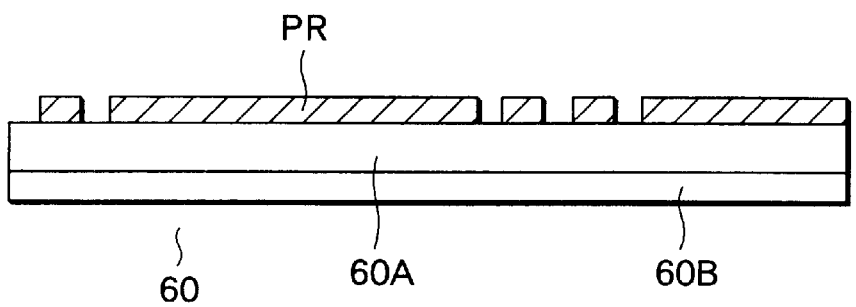
[FIG. 15]

Firstly, the photo-resist PR is made on the first conductive foil 60A, and patterned so that the first conductive foil 60A may be exposed except for the region which becomes the first conductive paths 51A to 51C, as shown in FIG. 15. And etching is performed via the photo-resist PR, as shown in FIG. 6.

The lateral face of the trench 61 formed by etching is rough, leading to increased adhesiveness of the insulating resin 50.

The lateral face of the trench 61 is etched isotropically, and curved. This step of removing can be wet etching, or dry etching. This curved structure produces the anchor effect. (For more details, refer to the first embodiment for the manufacturing method of the circuit device.)

In FIG. 15, a conductive material which is resistant to the etching solution may be selectively coated, instead of the photo-resist PR. If it is selectively coated on the portion for the first conductive paths, this conductive material serves as an etching protective film. As a result, the trench can be etched without the use of resist.

Figure 17:
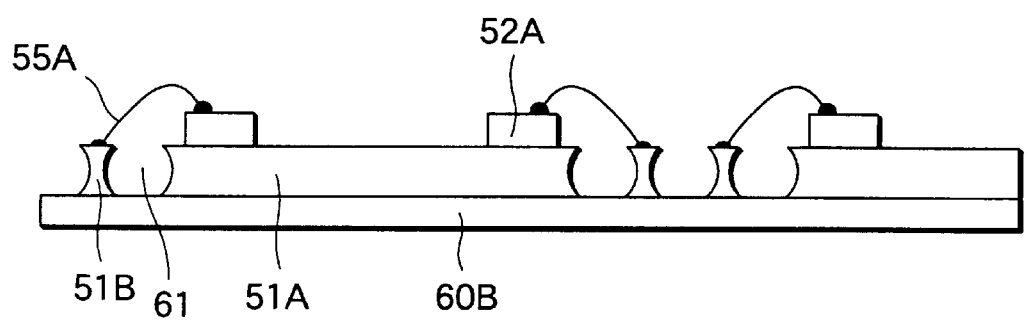
[FIG. 17]

Subsequently, there is a step of electrically connecting and mounting the circuit elements 52A to the first conductive foil 60A formed with the trench 61, as shown in FIG. 17.

The circuit elements 52A include semiconductor devices such as a transistor, a diode, and an IC chip, and passive elements such as a chip capacitor and a chip resistor. Also, though being thicker, the face down semiconductor devices (flip chip) such as CSP and BGA may be mounted.

Herein, the bare transistor chip 52A is die bonded to the conductive path 51A. Consequently, the emitter electrode and the first conductive path 51B, as well as the base electrode, and the conductive path 51B are connected via the bonding wire 55A.

Figure 18:
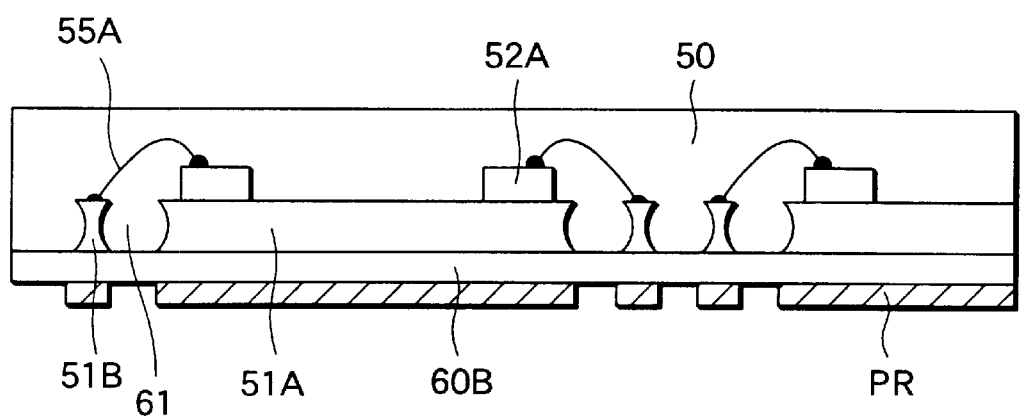
[FIG. 18]

Furthermore, there is a step of attaching the insulating resin 50 to the laminated conductive foil 60 and the trench 61, as shown in FIG. 18. This step can be performed by transfer molding, injection mold, dipping or application.

In this embodiment, the insulating resin applied on the surface of the laminated conductive foil 60 is adjusted to be about 100 μm thick from the top of the circuit elements. This thickness can be made thicker or thinner in view of the strength.

With the trench 61, the conductive foil 60A is not divided into the first conductive paths 51A to 51C, because the second conductive foil 60B is left behind like a sheet. Accordingly, this embodiment has a feature that the sheet laminated conductive foil 60 can be singly handled, facilitating the operation of carrying and mounting it to the mold when molding the insulating resin.

Subsequently, there is a step of removing the back face of the second conductive foil 60B chemically and/or physically or separation into the conductive paths 51. Herein, the step of removing is performed by etching. As a result, the second conductive paths 51S to 51U are exposed on the back face of the insulating resin 50.

Figure 19:
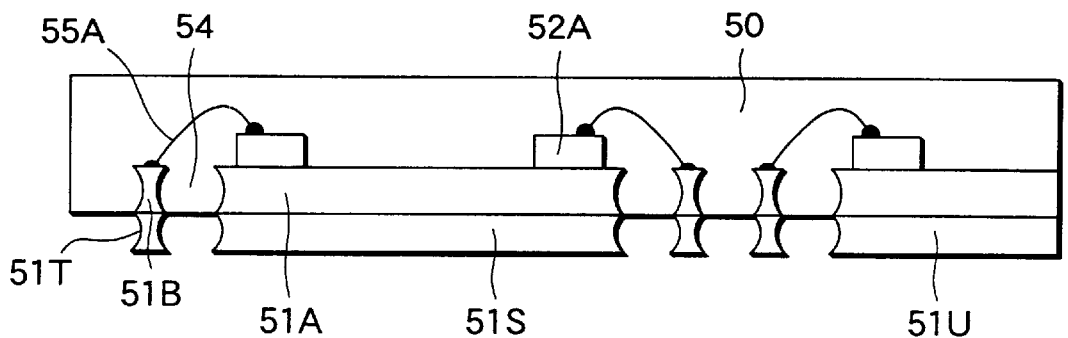
[FIG. 19]

Further, a conductive material such as solder is applied on the exposed second conductive paths 51S to 51U, as shown in FIG. 19.

Figure 20:
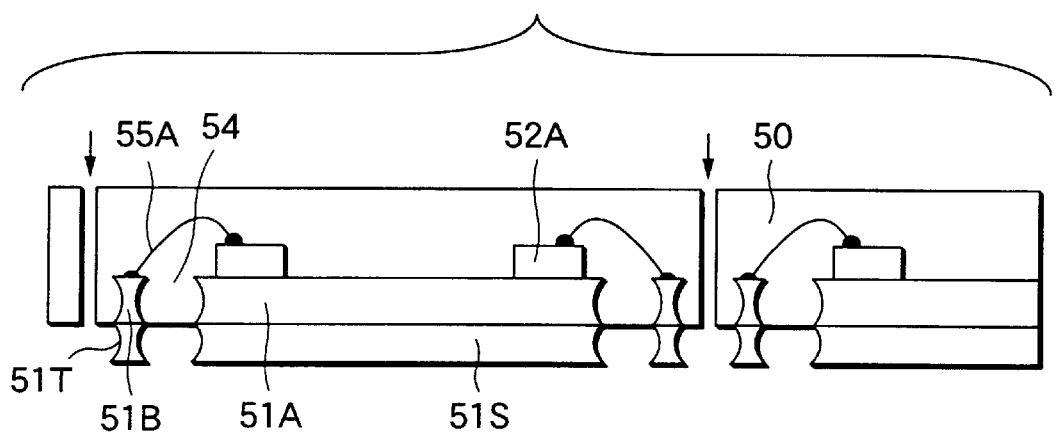
[FIG. 20]

Lastly, there is a step of completing the circuit device by separation into individual circuit elements, as shown in FIG. 20.

The separation line is indicated by the arrow, and separation can be effected by dicing, cut, press, or chocolate break. When using the chocolate break, a projection on the mold may be provided to form the groove at the separation line in coating the insulating resin.

Particularly, the dicing is mostly used in the manufacturing method of the semiconductor devices, and is preferable because it can cut very small things.

The manufacturing method as described in the first to third embodiments allows for the complex patterns, as shown in FIG. 28. Particularly, the wire is bent and integral with the bonding pad 26, the other end being electrically connected with the circuit element. The wire is narrow in width, and long. Therefore, the curvature caused by heat is very significant, resulting in exfoliation in the conventional structure. However, in the present invention, since the wires are buried into the insulating resin and supported, it is possible to prevent curvature, exfoliation and slippage of the wires. The bonding pad itself has a small plane area, and may be peeled in the conventional structure. However, since in the present invention, the bonding pad is buried into the insulating resin and supported by the insulating resin, with curved structure having the anchor effect, there is a merit of preventing the slippage.

Further, there is another merit that the circuit device having the circuit elements buried into the insulating resin 50 can be produced. This is similar to the conventional structure in which a circuit is incorporated into a printed circuit board or a ceramic substrate. This will be described later in connection with a way of mounting.

Figure 27:
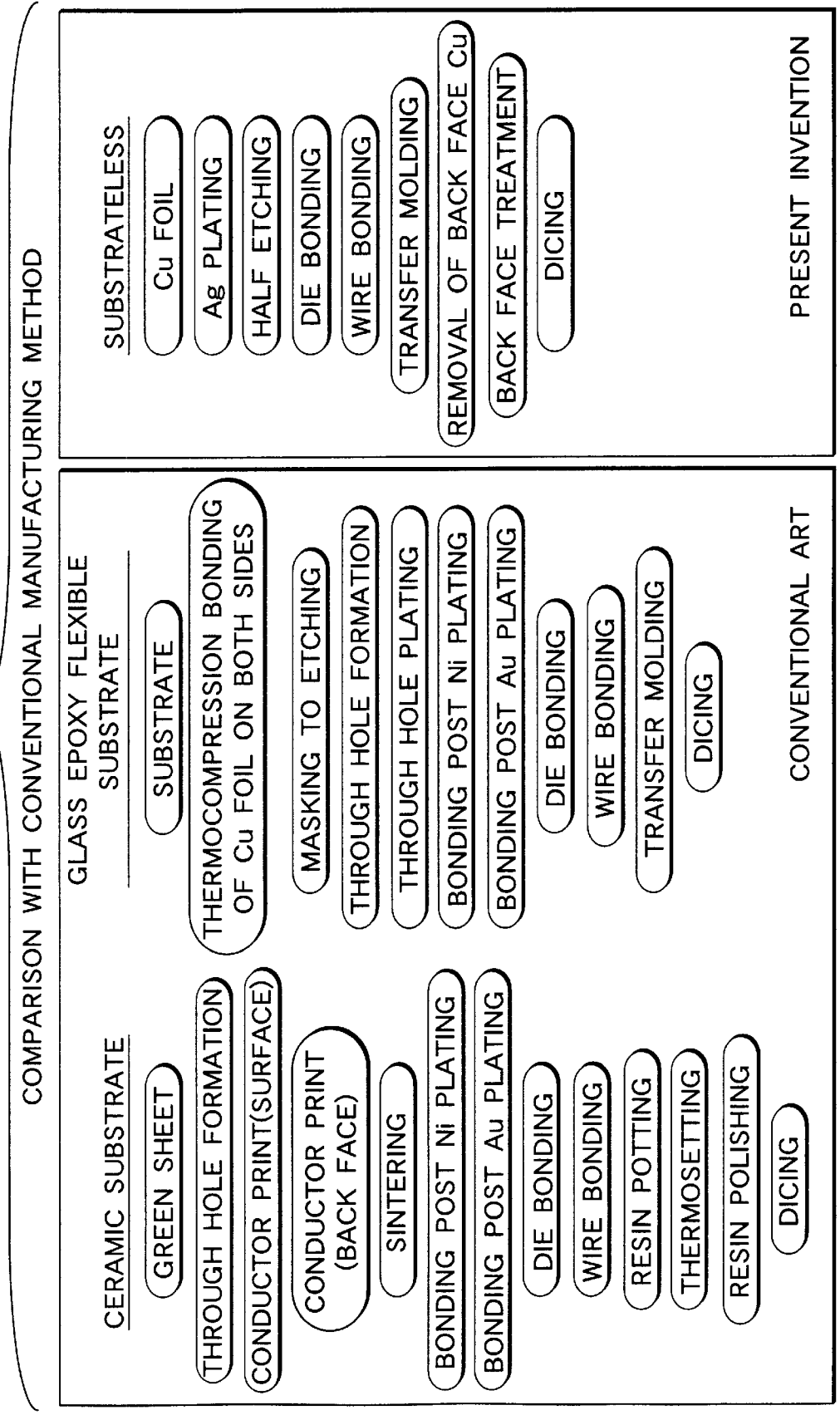
[FIG. 27]

To the right of FIG. 27, a simple flow diagram of the present invention is presented. The circuit device can be fabricated in accordance with the nine steps of preparing the laminated conductive foil, plating with Ag or Ni, etching the first conductive foil, die bonding, wire bonding, transfer molding, etching the second conductive foil, treating the back face of conductive path, and dicing. And all the steps can be performed in the inside work without supplying the support substrate from the manufacturer.

Mode for Providing Various Kinds of Circuit Devices and the Ways of Mounting FIG. 21 shows a circuit device 81 having a face down circuit element 80 mounted. The circuit element 80 is a bare semiconductor chip, CSP or BGA (flip chip) having sealed surface. FIG. 22 shows a circuit device 83 having a passive element 82 such as a chip resistor mounted. Since they are of thin type, and sealed by the insulating resin, they are superior in the environmental resistance.

Figure 23A:
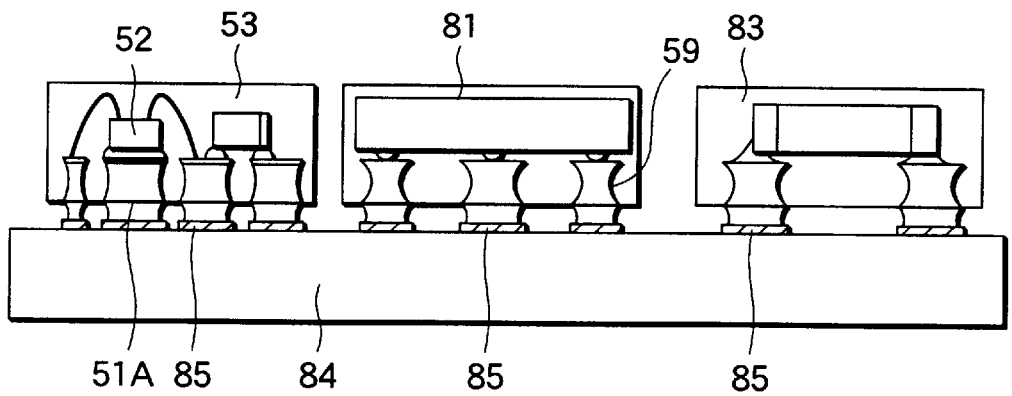
[FIG. 23]

FIG. 23 shows the mounting structure. Firstly, FIG. 23A shows the circuit devices 53, 56, 81, 83 as described above, which are mounted in the conductive paths 85 formed on a mounting substrate 84 such as a printed circuit board, metal substrate, or ceramic substrate.

Particularly, a conductive path 51A to which the back face of a semiconductor chip 52 is fixed is thermally coupled to the conductive paths 85 on the mounting substrate 84. Therefore, the heat of the circuit device can be radiated via the conductive paths. If the metal substrate is used for the mounting substrate 84, the temperature of the semiconductor chip 52 can be further decreased, due to radiation of the metal substrate. Therefore, the driving capability of the semiconductor chip can be enhanced.

For example, the power MOS, IGBT, SIT, large current driving transistors, and large current driving IC (MOS, BIP, Bi-CMOS) memory elements are preferable.

The metal substrates preferably include an Al substrate, a Cu substrate and a Fe substrate. In view of the short-circuit with the conductive paths 85, the insulating resin and/or oxide films are formed.

Figure 23B:
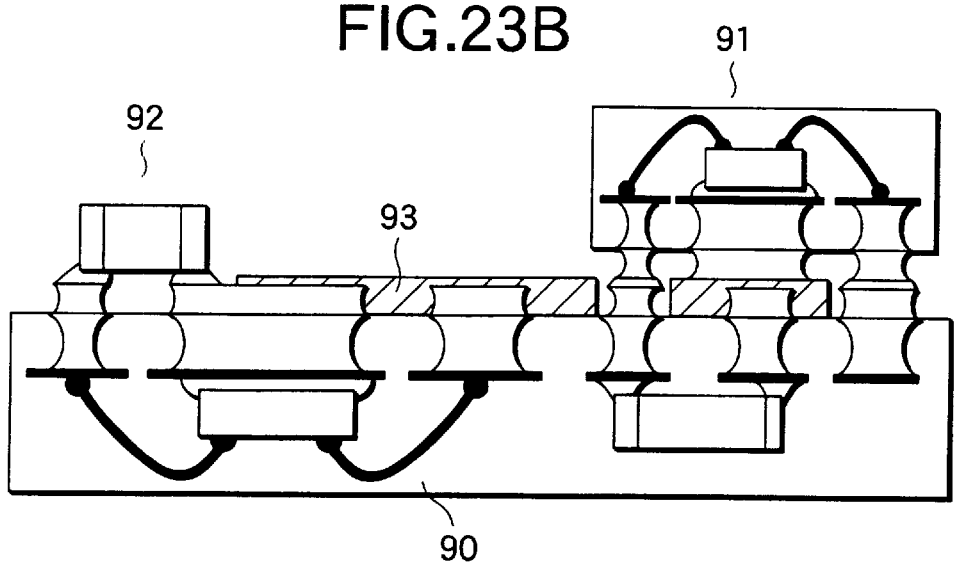
Figure 24:
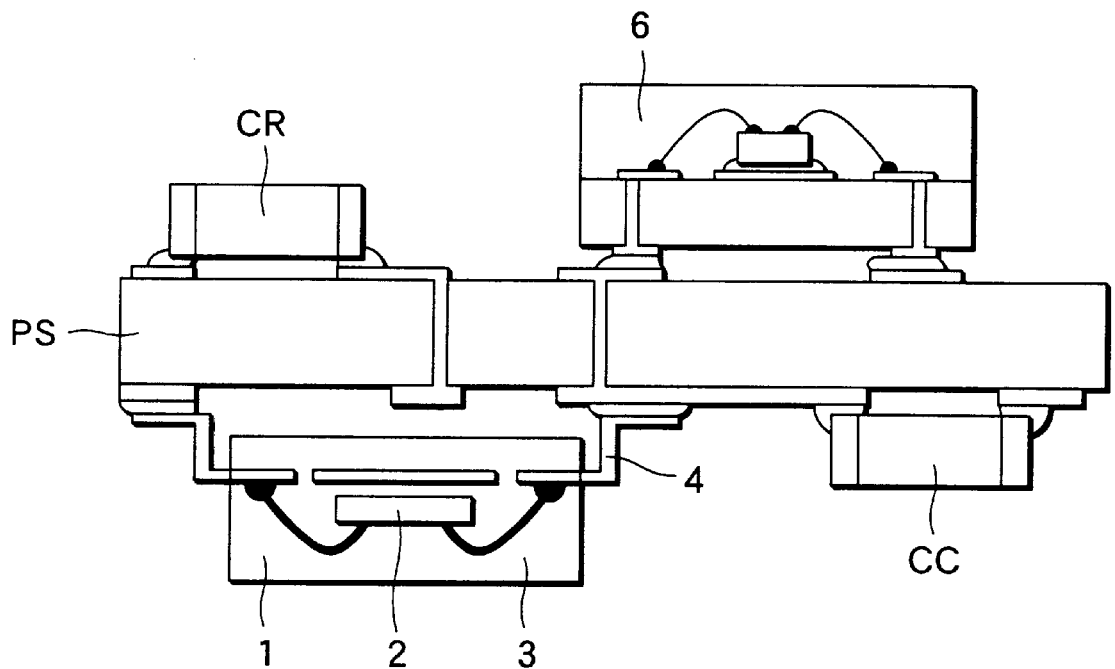
[FIG. 24]

FIG. 23B shows a circuit device 90 of the invention which is utilized as the substrate of FIG. 23A. This is the greatest feature of the present invention. Namely, the conventional printed circuit board or ceramic substrate has a through hole TH formed in the substrate. In the present invention, a substrate module containing an IC circuit can be fabricated. For example, at least one circuit (which may be contained as the system) is contained in the printed circuit board.

Conventionally, the support substrate used the printed circuit board or ceramic substrate. In the present invention, the substrate module does not need the support substrate. This substrate module can be thinner and lighter than a hybrid substrate which may be the printed circuit board, the ceramic substrate, or the metal substrate.

This circuit device 90 is utilized as the support substrate, and the circuit elements can be mounted in the exposed conductive paths, resulting in a high performance substrate module. Particularly, if this circuit device is a support substrate and a circuit device 91 is mounted on the support substrate, the substrate module can be made further thinner and lighter.

Accordingly, according to the above embodiments, an electronic apparatus with this module mounted can be reduced in size and weight.

The hatching part indicated by numeral 93 is an insulating film. For example, a high molecular film such as solder resist is preferable. Due to formation of this film, it is possible to prevent the conductive paths buried into the substrate 90 and the electrodes formed on the circuit elements 91 from short-circuiting.

Referring to FIG. 29, there will be described some merits of the present circuit device in the following. In the conventional mounting method, the semiconductor manufacturers fabricated the package type semiconductor devices and flip chips. The set makers mounted the semiconductor devices supplied from the semiconductor manufacturers and the passive elements supplied from the parts makers on the printed circuit board and incorporated the circuit devices into the set to fabricate an electronic apparatus. However, since the circuit device of this invention allows itself to be used as the mounting substrate, the semiconductor manufacturers can complete the mounting substrate module in the later process, and deliver it to the set makers. Accordingly, the set makers can greatly save the operation of mounting the elements on the substrate.

As will be clearly understood, the present invention can fabricate the circuit devices with the conductive paths and the minimum amount of insulating resin, resulting in less wasteful resources. Hence, the circuit devices can be fabricated with less superfluous components up to completion, and with greatly reduced cost. The film thickness of insulating resin, and the thickness of conductive foil, can be optimized, to make the circuit device smaller, thinner and lighter. Furthermore, since the wires liable to curvature or exfoliation are buried into the insulating resin, those problems can be resolved.

Since the back face of conductive paths is exposed from the insulating resin, the back face of conductive paths can be directly contacted with the external. Hence, there is an advantage that the back face electrode and through hole of the conventional structure can be dispensed with.

When the circuit elements are directly fixed via the conductive coat made of the brazing material, Au or Ag, the heat developed by the circuit elements can be transferred directly via the conductive paths to the mounting substrate, because the back face of conductive paths is exposed. Particularly, the power elements can be also mounted, due to this heat radiation.

Since the conductive paths has the curved structure on the lateral face, and/or the second material is formed on the surface of conductive paths, a visor applied to a conductive path can be formed, bringing about the anchor effect to prevent the conductive paths from warping and slipping.

In the manufacturing method of the circuit device according to the present invention, the conductive foil itself serving as the conductive paths is utilized as the support substrate. The whole substrate is supported by the conductive foil, up to the steps of forming the trench or mounting the circuit elements and applying the insulating resin, while to divide the conductive foil into the conductive paths, the insulating resin is used as the support substrate. Accordingly, the circuit device of the invention can be manufactured with the least amount of circuit elements, conductive foil, and insulating resin, as required. As described in the conventional example, this circuit device can be fabricated without need of having the support substrate and with the reduced cost. Since the support substrate is unnecessary, the conductive paths are buried into the insulating resin, with the adjustable thickness of the insulating resin and the conductive foil, there is a merit that the circuit device can be made very thin. In forming the trench, the curved structure results, bringing about the anchor effect.

As will be apparent from FIG. 27, the steps of forming the through hole and printing the conductors (for the ceramic substrate) can be omitted. Therefore, the manufacturing process can be significantly shortened, and advantageously the whole process can be performed in the inside work. Also, the frame mold is unnecessary at all, leading to quite short delivery.

Since the conductive paths can be treated integrally, there is an advantage of the enhanced workability in the later step of coating the insulating resin.

Lastly, this circuit device can be utilized as the support substrate to mount the circuit elements in the exposed conductive paths, resulting in a substrate module with high performance. Particularly, if this circuit device is used as the support substrate and the circuit device 91 as the circuit element is mounted thereon, the substrate module can be made lighter and thinner.

What is claimed is:

1. A method for manufacturing a circuit device, comprising:
    disposing a first conductive foil over a second conductive foil, the first conductive foil comprising a different metal than the second conductive foil;
    forming a first conductive path in the first conductive foil while leaving the second conductive foil intact;
    mounting a circuit element on the first conductive foil and electrically coupling the circuit element to said conductive path;
    disposing an insulating resin over said circuit element and said first conductive path; and
    removing at least a portion of said second conductive foil.

2. A method for manufacturing a circuit device, according to claim 1, wherein forming the first conductive path comprises patterning so that a lateral face of the first conductive path is curved.

3. A method for manufacturing a circuit device, according to claim 1, wherein the first conductive foil comprises copper.

4. A method for manufacturing a circuit device, according to claim 1, further comprising:
    forming a curved lateral face of the first conductive path; and
    excluding from removal at least a portion of the second conductive foil corresponding to said first conductive path.

5. A method for manufacturing a circuit device, according to claim 1, comprising:
    forming a trench in said first conductive foil to produce a curved lateral face in the first conductive foil while forming the first conductive path; and
    forming a second conductive path in the second conductive foil, the second conductive path being complementary to the first conductive path.

6. A method for manufacturing a circuit device, comprising:
    disposing a first conductive foil over a second conductive foil, the first conductive foil comprising a different metal than the second conductive foil;
    forming a trench in said first conductive foil to produce a first conductive path with curved sides while not affecting the second conductive foil;
    disposing a circuit element on said conductive path;
    connecting an electrode of said circuit element to said first conductive path by a connecting means;
    providing an insulating resin over said circuit element, said connecting means and said first conductive path, and filing said trench with the insulating resin; and
    forming a second conductive path in the second conductive foil without affecting the first conductive foil, the second conductive path being complementary to the first conductive path.

7. A method for manufacturing a circuit device, according to claim 6, further comprising:
    forming a corrosion resistant conductive coat in at least a region on said first conductive foil before forming the first conductive path; and
    severing said insulating resin for separation into individual circuit devices after forming the second conductive path.

8. The method for manufacturing the circuit device according to claim 1, wherein said second conductive foil comprises copper.

9. The method for manufacturing the circuit device according to claim 1, wherein said second conductive foil comprises aluminum or iron-nickel.

10. The method for manufacturing the circuit device according to claim 1, wherein said first conductive foil is formed by plating.

11. The method for manufacturing the circuit device according to claim 1, wherein said second conductive foil comprises aluminum and said first conductive foil comprises copper.

12. The method for manufacturing the circuit device according to claim 1, wherein said first conductive foil comprises aluminum or copper.

13. The method for manufacturing the circuit device according to claim 7, wherein said conductive coat comprises nickel or silver.

14. The method for manufacturing the circuit device according to claim 5, further comprising:
    chemically or physically etching said first conductive foil to form said trench.

15. The method for manufacturing the circuit device according to claim 7, further comprising:
    using said conductive coat as part of a mask when forming said trench.

16. The method for manufacturing the circuit device according to claim 1, wherein said circuit element comprises any one or two of a semiconductor bare chip, a flip chip, a chip circuit component, a package semiconductor element, and a CSP.

17. The method for manufacturing the circuit device according to claim 6, wherein said connecting means comprises a wire bonding or brazing material.

18. The method for manufacturing the circuit device according to claim 1, further comprising:

disposing said insulating resin by transfer molding.

19. The method for manufacturing the circuit device according to claim 1, further comprising:

dicing said circuit device into individual circuits.

20. The method for manufacturing the circuit device according to claim 1, wherein said conductive path comprises a wire.

21. The method for manufacturing the circuit device according to claim 5, wherein said conductive coat is plated with nickel or silver.

22. A method for manufacturing a circuit device, according to claim 1, comprising:

disposing a first conductive foil over a second conductive foil, the first conductive foil comprising a different metal than the second conductive foil;

disposing a corrosion resistant conductive coat on at least a region which becomes the first conductive path on the surface of said first conductive foil;

forming a first conductive path having a curved lateral face by forming a trench in the first conductive foil while leaving the second conductive foil intact;

disposing a circuit element on said desired first conductive path;

providing connecting means for electrically connecting an electrode of said circuit element with said desired first conductive path;

coating and molding said circuit element, said connecting means and said first conductive path with an insulating resin filling said trench; and forming a second conductive path in the second conductive foil on the back face of said first conductive path.

23. A method of manufacturing a circuit device, comprising:

disposing a first conductive foil over a second conductive foil, the first conductive foil having a different etching rate than the second conductive foil;

selectively etching the first conductive foil to form a first conductive pattern, said second conductive foil acting as an etching stopper;

mounting a circuit element on the selectively etched first conductive foil and electrically coupling the circuit element to the first conductive foil; and disposing an insulating resin over said circuit element and said first conductive foil; and selectively etching the second conductive foil while leaving the first conductive foil intact to form a second conductive pattern complementary to the first conductive pattern.

24. The method according to claim 23, wherein first conductive foil comprises copper and the second conductive foil comprises aluminum.

25. The method according to claim 23, wherein second conductive foil comprises copper and the first conductive foil comprises aluminum.

26. A method of manufacturing a circuit device comprising:

disposing a first conductive foil over a second conductive foil, the first conductive foil having a different etching rate than the second conductive foil, disposing a conductive material over the first conductive foil, said conductive material having a lower etching rate than the first conductive foil;

selectively etching the conductive material and the first conductive foil to form a trench in the first conductive foil, said second conductive foil acting as an etching stopper, and said conductive material forming a lip that protrude at an edge of the trench;

mounting a circuit element on the selectively etched first conductive foil and electrically coupling the circuit element to the first conductive foil; and disposing an insulating resin over said circuit element and said first conductive foil and filling the trench; and selectively etching the second conductive foil while leaving the first conductive foil intact to form a trench in the second conductive foil complementary to the resin-filled trench in the first conductive foil.

27. The method according to claim 26, wherein first conductive foil comprises copper and the second conductive foil comprises aluminum.

28. The method according to claim 26, wherein second conductive foil comprises copper and the first conductive foil comprises aluminum.

29. The method according to claim 26, wherein the conductive material comprises nickel.

\* \* \* \* \*